United States Patent
Uehara et al.

(10) Patent No.: US 7,706,552 B2
(45) Date of Patent: Apr. 27, 2010

(54) SOUND SIGNAL PROCESSING APPARATUS AND SOUND SIGNAL PROCESSING METHOD

(75) Inventors: Yoichi Uehara, Kanagawa (JP); Keisuke Ozawa, Tokyo (JP); Kohei Kanou, Kanagawa (JP); Shinji Hirose, Kanagawa (JP)

(73) Assignee: Sony Corporation, Tokyo (JP)

( * ) Notice: Subject to any disclaimer, the term of this patent is extended or adjusted under 35 U.S.C. 154(b) by 1221 days.

(21) Appl. No.: 11/074,519

(22) Filed: Mar. 8, 2005

(65) Prior Publication Data

US 2005/0207594 A1 Sep. 22, 2005

(30) Foreign Application Priority Data

Mar. 10, 2004 (JP) ............................. 2004-067480

(51) Int. Cl.
  H03G 7/00 (2006.01)
  H03G 3/00 (2006.01)
  H03G 3/20 (2006.01)

(52) U.S. Cl. ...................... 381/106; 381/107; 381/108; 381/104; 381/57

(58) Field of Classification Search ......... 381/104–109, 381/57

See application file for complete search history.

(56) References Cited

U.S. PATENT DOCUMENTS

| 4,747,065 A | 5/1988 | West |
| 5,528,695 A | 6/1996 | Klippel |
| 5,642,075 A | 6/1997 | Bell |
| 5,666,424 A * | 9/1997 | Fosgate et al. ................. 381/18 |
| 5,838,807 A | 11/1998 | Andersson et al. |
| 6,731,767 B1 | 5/2004 | Blamey et al. |

FOREIGN PATENT DOCUMENTS

| EP | 0 218 870 A2 | 4/1987 |
| GB | 2 277 840 A | 11/1994 |
| JP | SHO 59-36686 | 3/1984 |
| JP | 2001-077645 | 3/2001 |
| JP | 2001-238300 | 8/2001 |
| JP | 2002-084589 | 3/2002 |
| JP | 2003-348682 | 12/2003 |
| WO | WO 97/15114 | 4/1997 |
| WO | WO 00/47014 | 9/2000 |

OTHER PUBLICATIONS

Japanese Office Action Issued in Counterpart Application No. 2004-067480 (2 pages).

* cited by examiner

*Primary Examiner*—Xu Mei
*Assistant Examiner*—George C Monikang
(74) *Attorney, Agent, or Firm*—Finnegan, Henderson, Farabow, Garrett & Dunner, L.L.P.

(57) ABSTRACT

A satisfactory sound volume sensation from a hearing point of view can be obtained, and an effective sound volume correction operation can be obtained with an algorithm as simple as possible. Correction step 0 (correction function off, level correction value 0) to correction step 16 (level correction value—16 dB) are defined. When a first condition that is defined in such a manner as to correspond to a state in which distortion occurs is satisfied, the correction step is made to proceed by one step from the current correction step (−1 dB is added to a level correction value). When a second condition that is defined in such a manner as to correspond to a state in which distortion does not occur is satisfied, the correction step is made to return by one step from the current correction step (−1 dB is subtracted from the level correction value).

5 Claims, 10 Drawing Sheets

SOUND SIGNAL PROCESSING APPARATUS AND SOUND SIGNAL PROCESSING METHOD

BACKGROUND OF THE INVENTION

1. Field of the Invention

The present invention relates to a sound signal processing apparatus for adjusting a sound volume and a sound signal processing method for use with the sound signal processing apparatus.

2. Description of the Related Art

Various sound playback apparatuses having a function for correcting output sound by suppressing the volume of output sound are known. Such a sound volume correction function prevents, for example, the occurrence of distortion due to an excessive level. Furthermore, sound is not output at a larger volume than necessary due to an inadvertent sound volume operation, and a user does not experience annoyance. Also, a sound output circuit system, a speaker, etc., are prevented from being destroyed by an excessive signal input (see, for example, Japanese Unexamined Patent Application Publication Nos. 2001-77645 and 2002-84589).

In a case where the above-described sound volume correction function is mainly provided for the purpose of preventing distortion of sound and protecting circuits, etc., when, for example, a configuration in which the signal level is simply limited to a particular fixed signal level or lower, there are cases in which, for example, the sound volume suppression is more than necessary, and the sound volume sensation expected by the user is deteriorated. This situation leads to, for example, the sound being regarded as an unattractive playback sound by the user.

Therefore, the control for sound volume correction is required to be properly performed in such a way that both the distortion prevention effect and the obtainment of sufficient sound volume sensation from a hearing point of view can be managed. Also, an algorithm for such sound volume correction is preferably as simple as possible when the circuit size, the amount of memory usage corresponding to the size of a program, etc., are taken into consideration.

SUMMARY OF THE INVENTION

Accordingly, in view the above-described problems, in one aspect, the present invention provides a sound signal processing apparatus including: level varying means for setting and outputting the level of an input sound signal in accordance with sound volume operation information and level correction information; determination means for determining whether or not the level of a sound signal output from the level varying means satisfies a predetermined condition; and level correction means for updating the current level correction information to new level correction information obtained by adding or subtracting a predetermined amount of correction to or from the current level correction information when the determination means determines that the level of the output sound signal satisfies the predetermined condition.

In another aspect, the present invention provides a sound signal processing method including: a level varying step of setting and outputting the level of an input sound signal in accordance with sound volume operation information and level correction information; a determination step of determining whether or not the level of the sound signal output in the level varying step satisfies a predetermined condition; and a level correction step of updating the current level correction information to new level correction information obtained by adding or subtracting a predetermined amount of correction to or from the current level correction information when it is determined in the determination step that the level of the output sound signal satisfies the predetermined condition.

According to each of the above-described configurations, in order to vary the level (sound volume) of a sound signal in accordance with a sound volume varying operation, the level varying means (step) is provided. In this state, in response to the determination means (step) determining that the level of the audio signal output from the level varying means (step) satisfies the predetermined condition, the audio signal level that is set by the level varying means (step) in response to the sound volume operation is changed by a new amount of correction obtained by adding or subtracting a predetermined amount of correction to or from the current level of correction information.

In such a configuration, first, how sound volume correction works is determined by the above-described specific condition and the setting of the amount of correction.

Furthermore, the level correction means (step) changes the level of the level varying means (step) on the basis of the output of the level varying means (step), that is, the level of the audio signal after the level is varied by the level varying means (step). That is, feedback control on the level varying means (step) is performed. This means that level varying control by the level varying means (step) becomes effective for the audio signal level set by the level varying means (step) in response to the sound volume varying operation.

As a result of the foregoing, in the present invention, the necessary sound volume correction effect can be obtained easily and appropriately by the details of the condition for performing level control for sound volume correction and by the setting of the amount of correction. That is, for example, a sound volume control effect such that, for example, both the prevention of distortion and sufficient sound volume sensation can be managed can be easily obtained by taking the condition and the amount of correction into consideration. Furthermore, also, when the sound volume correction effect works, natural sound volume changes, from a hearing point of view, can be obtained. Also, when an appropriate sound volume correction effect that is regarded as being advantageous from a hearing point of view is to be obtained in this manner, this can be realized by a simple algorithm. Therefore, the functions corresponding to the present invention can be implemented with, for example, a compact circuit and a small program.

Furthermore, in the present invention, since level varying control for the level varying means (step) by the level correction means (step) is feedback control, as described above, corrections are performed appropriately in response to, for example, changes of the audio signal level due to the sound volume varying operation. This also makes it possible to obtain a sound volume correction effect that is regarded as being advantageous from a hearing point of view.

DESCRIPTION OF THE PREFERRED EMBODIMENTS

Embodiments for carrying out the present invention will now be described below. As one embodiment, an example is described in which a sound signal processing apparatus based on the present invention is applied to a sound playback apparatus capable of sound playback in a multi-channel system.

Figure 1:
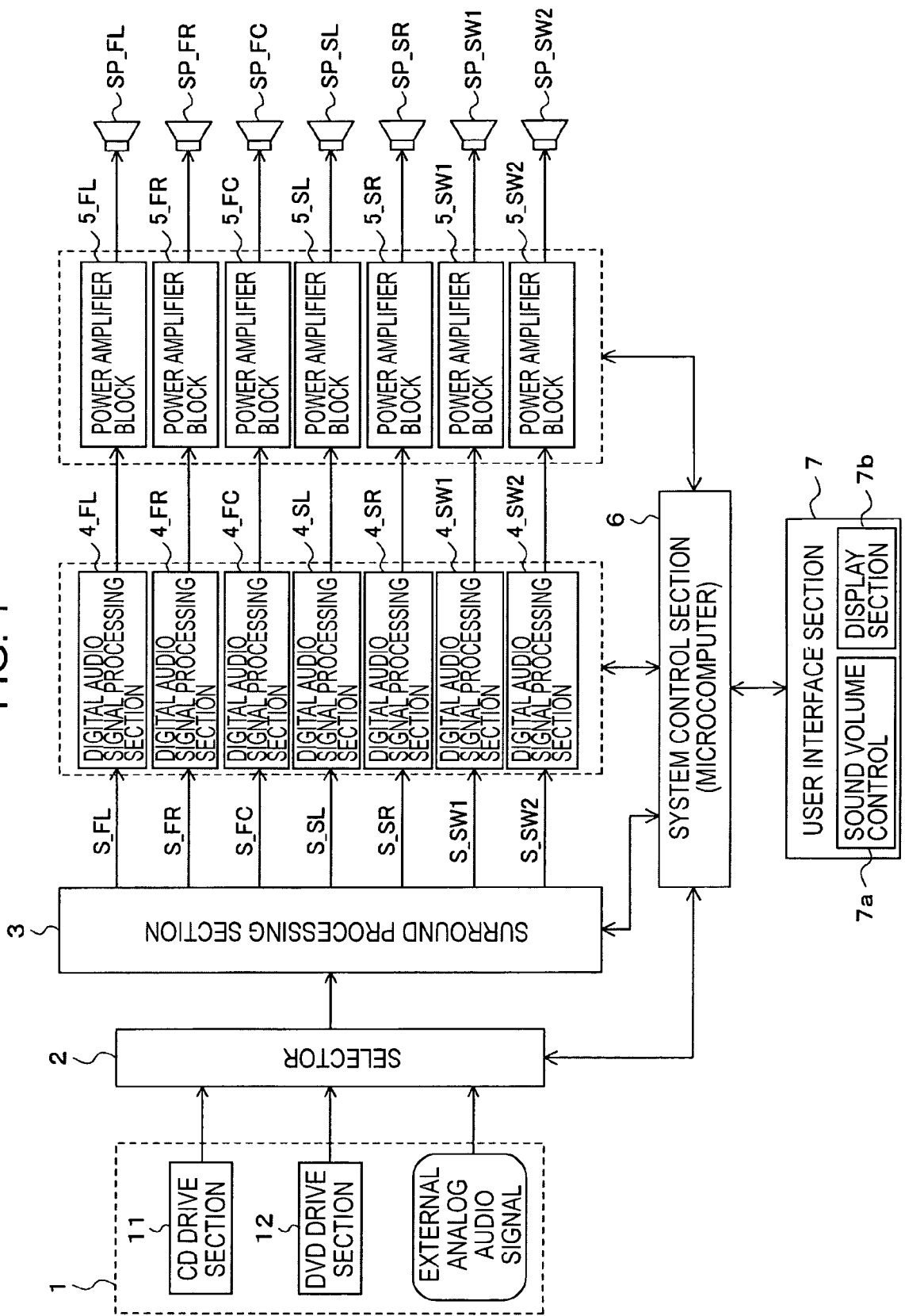
FIG. 1 is a block diagram showing the overall configuration of a sound playback apparatus according to an embodiment of the present invention.

The block diagram of FIG. 1 shows the overall configuration of the sound playback apparatus of this embodiment.

First, in the sound playback apparatus shown in FIG. 1, a sound source input section 1 is provided. The sound source input section 1 is a part for receiving and obtaining a sound source to be played back.

In this case, the sound source input section 1 includes a CD drive section 11 and a DVD drive section 12. The CD drive section 11 plays back a loaded audio CD (Compact Disc) and outputs a digital audio (sound) signal to a selector 2. The DVD drive section 12 plays back a loaded DVD (Digital Versatile Disc). In a DVD on which, for example, video/audio content is recorded, video signals and audio signals are compression-coded and are recorded by, for example, an MPEG2 format in such a manner that these signals are synchronized with respect to the playback time. In the DVD drive section 12, reading from such a DVD is performed to obtain data corresponding to video signals and data corresponding to audio signals. Of the data corresponding to the video signals and data corresponding to the audio signals, the data corresponding to the video signals is input to a decoding processing circuit system (not shown). With respect to the data of the video signals, decoding processing compliant with the format of the above-mentioned compression-coding is performed by the processing of the decoding processing circuit system, and digital video signals are obtained. The data of the audio signals is output to the selector 2.

In the sound source input section 1 in this case, an external analog audio signal can also be input. That is, the sound source input section 1 is provided with an audio signal input terminal for externally inputting an analog audio signal so that an analog audio signal supplied from the audio signal input terminal is input and obtained. Furthermore, in the sound source input section 1, the analog audio signal input in this manner is subjected to an A/D conversion process so as to be converted into a digital audio signal and is input to the selector 2.

Here, the operation of each drive section in the sound source input section 1 is controlled by a system control section 6.

The sound source to be input and obtained by the sound source input section 1 need not be restricted to the above-mentioned audio signals obtained by playing back a CD and a DVD and audio signals that are externally input in analog form. The sound source may be configured in such a way that, for example, a television tuner is provided in the sound source input section 1, so that audio signals among the video and audio signals obtained by selecting the station of a television broadcast are obtained. The sound source that is externally input may be configured in such a way that, for example, a digital audio signal is input and obtained by a predetermined transmission format.

With respect to audio signals of a plurality of systems, which are input from the sound source input section 1 in the above-described manner, the selector 2 selects one audio signal under the control of the system control section 6 and outputs the audio signal to a surround processing section 3.

In the surround processing section 3, a predetermined signal process for converting the input audio signal into multi-channel signals is performed.

First, when the input audio signal is, for example, data of an audio signal played back by the DVD drive section 12 and is originally multi-channel compatible, a decoding process for compression coding is performed, and as an output of this decoding process, a digital audio signal corresponding to each channel is obtained.

In the case of a signal, which is originally in a two-channel format including L (left) and R (right) components, including a digital audio signal played back from a CD, or originally in a monaural format, by performing predetermined signal processing, a digital audio signal corresponding to each channel is generated in a pseudo-manner from the input audio signal.

In this embodiment, as the multi-channel sound playback is performed using 5.2 ch formed of five full-range channels made up of a front left (L) channel (FL), a front right (R) channel (FR), a front center (C) channel (FC), a surround (rear) left channel (SL), and a surround (rear) right channel (SR), and two subwoofer channels made up of a subwoofer 1 (SW1) and a subwoofer 2 (SW2). The surround processing section 3 outputs digital audio signals (S_FL, S_FR, S_FC, S_SL, S_SR, S_SW1, and S_SW2) corresponding to each of the channels.

Then, the digital audio signals (S_FL, S_FR, S_FC, S_SL, S_SR, S_SW1, and S_SW2) are input to digital audio signal processing blocks (4_FL, 4_FR, 4_FC, 4_SL, 4_SR, 4_SW1, and 4_SW2), respectively, which are provided so as to correspond to each of the channels.

The digital audio signal processing blocks (4_FL, 4_FR, 4_FC, 4_SL, 4_SR, 4_SW1, and 4_SW2) each perform predetermined signal processing on the input digital audio signal. For the signal processing here, for example, equalizing processing corresponding to sound quality varying in response to a user operation, predetermined adaptive control, etc., level varying processing in response to sound volume adjustment instructions based on a sound volume operation, and other processing are performed. Parts relating to level varying will be described later. Operation control for each of the digital audio signal processing blocks (4_FL, 4_FR, 4_FC, 4_SL, 4_SR, 4_SW1, and 4_SW2) is performed by the system control section 6.

Then, the digital audio signals on which signal processing is performed by the digital audio signal processing blocks (4_FL, 4_FR, 4_FC, 4_SL, 4_SR, 4_SW1, and 4_SW2) are adjusted so that the mutual signal output timings become appropriate, and thereafter are input to power amplifier blocks (5_FL, 5_FR, 5_FC, 5_SL, 5_SR, 5_SW1, and 5_SW2) corresponding to each of the channels.

Each of the digital audio signal processing blocks (4_FL, 4_FR, 4_FC, 4_SL, 4_SR, 4_SW1, and 4_SW2) outputs a digital audio signal at a predetermined identical sampling frequency and by quantization bits.

In this case, each of the power amplifier blocks (5_FL, 5_FR, 5_FC, 5_SL, 5_SR, 5_SW1, and 5_SW2) is configured as a so-called digital amplifier such that a D-class power amplifier is provided at the output stage. In this case, the power amplifier blocks (5_FL, 5_FR, 5_FC, 5_SL, 5_SR, 5_SW1, and 5_SW2) may basically adopt a common configuration. The basic configuration of the power amplifier block will be described later.

As described above, the power amplifier blocks (5_FL, 5_FR, 5_FC, 5_SL, 5_SR, 5_SW1, and 5_SW2) input a digital audio signal corresponding to each channel and perform a D-class amplification operation in order to drive respective speakers (SP_FL, SP_FR, SP_FC, SP_SL, SP_SR, SP_SW1, and SP_SW2). As a result, sound of the corresponding channel is output from each of the speakers (SP_FL, SP_FR, SP_FC, SP_SL, SP_SR, SP_SW1, and SP_SW2). At this time, if the speakers (SP_FL, SP_FR, SP_FC, SP_SL, SP_SR, SP_SW1, and SP_SW2) are arranged at an appropriate positional relationship, surround sound can be listened to with satisfactory balance at a listening position.

The predetermined operation for the power amplifier blocks (5_FL, 5_FR, 5_FC, 5_SL, 5_SR, 5_SW1, and 5_SW2) can be controlled by the system control section 6.

The system control section 6 includes a microcomputer composed of, for example, a CPU (Central Processing Unit), a RAM (Random Access Memory), a ROM (Read Only Memory), etc. As is understood from the description up to this point, the system control section 6 performs various kinds of processing for a sound playback apparatus to operate appropriately, the processing including operation control for each section shown in FIG. 1.

A user interface section 7 is connected to the system control section 6. For the user interface section 7, parts that function as a so-called user interface, such as various kinds of controls (including a remote controller, a receiving section therefor, etc.) provided for the user to operate the sound playback apparatus and a display section 7b (the display device forming the display section is not particularly limited) for displaying predetermined information, including the operating state of the sound playback apparatus, are shown in a summarized manner.

The user interface section 7 outputs an operation command corresponding to the predetermined operation performed on the predetermined control to the system control section 6. The system control section 6 performs predetermined control processing in response to the input operation command. Also, the system control section 6 performs a display control process for displaying images. As a result, in a display section 7b, a necessary display of content is performed. The display device forming the display section 7b needs not to be particularly limited.

In the user interface section 7, as a control in accordance with the present embodiment, in particular, a sound volume control 7a is shown. The sound volume control 7a is a control for performing overall sound volume adjustment on the sound output from the speakers (SP_FL, SP_FR, SP_FC, SP_SL, SP_SR, SP_SW1, and SP_SW2). That is, if an operation for turning up/down (increasing/decreasing) the sound volume is performed as the operation for the sound volume control 7a, the sound volume of the entire surround sound by the output sound from all the speakers (SP_FL, SP_FR, SP_FC, SP_SL, SP_SR, SP_SW1, and SP_SW2) is controlled to increase or decrease in accordance with the amount of increase or decrease due to the operation at this time. As a result, as the surround sound, an increase or decrease of the sound volume is made as a whole without the sound volume balance of each channel being deteriorated.

Such sound volume control is performed by the system control section 6. An operation command for indicating the amount of the increase or decrease of the sound volume is input to the system control section 6 in response to the operation performed on the sound volume control 7a. In response to this operation command, the system control section 6 performs control so that an increase or decrease of the identical amount of sound volume is obtained with respect to the audio signals output from each of the digital audio signal processing blocks (4_FL, 4_FR, 4_FC, 4_SL, 4_SR, 4_SW1, and 4_SW2). For this purpose, for example, a control signal for indicating an increase or decrease of the sound signal level is commonly output to each of the digital audio signal processing blocks (4_FL, 4_FR, 4_FC, 4_SL, 4_SR, 4_SW1, and 4_SW2).

As the sound volume control 7a, various kinds, including, for example, a dial-like control by which a rotation operation is possible or a control combined with so-called up/down keys, may be used. Furthermore, functions as the sound volume control 7a may be implemented by a predetermined operation on a GUI screen displayed on the display section 7b. That is, the type of control as the sound volume control and the operation mode corresponding thereto need not to be particularly limited.

In the following description, when channels need not to be particularly distinguished and are described as being formed commonly or collectively with respect to the digital audio signal processing blocks (4_FL, 4_FR, 4_FC, 4_SL, 4_SR, 4_SW1, and 4_SW2), the power amplifier blocks (5_FL, 5_FR, 5_FC, 5_SL, 5_SR, 5_SW1, and 5_SW2), and the speakers (SP_FL, SP_FR, SP_FC, SP_SL, SP_SR, SP_SW1, and SP_SW2), they are simply described as a digital audio signal processing block 4, a power amplifier block 5, and a speaker SP, respectively.

The configuration of the sound playback apparatus of the embodiment shown in FIG. 1 shows only a basic example. In practice, function parts may be added as necessary or necessary parts may be changed as appropriate.

Figure 2:
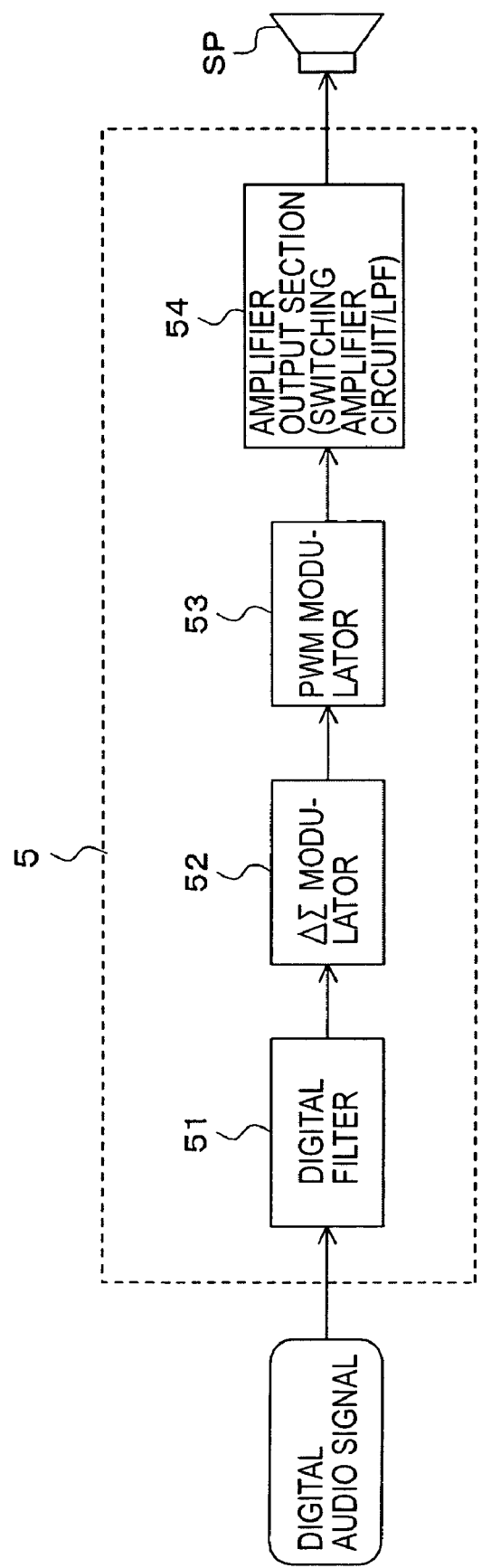
FIG. 2 is a block diagram showing an example of the configuration of a power amplifier block in the sound playback apparatus according to the embodiment of the present invention.

FIG. 2 shows an example of the basic configuration of the power amplifier block 5 shown in FIG. 1. That is, the configuration is a basic configuration that is common among the power amplifier blocks (5_FL, 5_FR, 5_FC, 5_SL, 5_SR, 5_SW1, and 5_SW2). In the manner described above, the power amplifier block 5 of this embodiment adopts a configuration as a digital amplifier having an amplification stage for a D-class operation.

The power amplifier block 5 in this case includes a digital filter 51, and a $\Delta\Sigma$ modulator 52, a PWM modulator 53, and an amplifier output section 54.

A digital audio signal at a predetermined sampling frequency and by quantization bits, which is output from the digital audio signal processing block 4, is input to the digital filter 51. Then, the digital filter 51 performs, on the digital audio signal that is input, a predetermined digital signal process, including so-called oversampling, for performing re-sampling at a sampling frequency that is at a predetermined multiple of the original sampling frequency. The digital audio signal on which signal processing is performed by the digital filter 51 in this manner is output to the $\Delta\Sigma$ modulator 52.

As is well known, the ΔΣ modulator 52 includes an integrator, a quantizer, etc., and is configured so as to apply negative feedback of the output of the quantizer to the input of the integrator. As a result of such a configuration, the word length of the quantization bits of the input digital audio signal is decreased to a predetermined number of bits. Also, the ΔΣ modulator 52 performs processing of so-called "noise shaping" for shifting quantization noise components that occur at this time to a band higher than the audio band. This is called ΔΣ modulation. The digital audio signal that is ΔΣ modulated in this manner becomes a 1-bit pulse sequence in which the densities of 1 and 0 change in accordance with the changes of the amplitude of the sound signal waveform with respect to the time axis when the digital audio signal is viewed as a sound signal waveform. The ΔΣ modulation signal by a 1-bit pulse sequence, which is obtained in this manner, is input to the PWM modulator 53.

In the PWM modulator 53, a pulse width modulation (PWM) process is performed on the input ΔΣ modulation signal. As described above, the ΔΣ modulation signal is a 1-bit pulse sequence in which the densities of "1" and "0" change in accordance with the amplitude of the sound signal waveform. As a result of this signal being modulated by PWM, a PWM signal in which the pulse width changes (the amplitude is fixed) according to the densities of "1" and "0" is generated. That is, a signal whose pulse width is varied according to the amplitude of the sound signal waveform corresponding to the ΔΣ modulation signal is obtained.

The PWM signal output from the PWM modulator 53 is input to the amplifier output section 54.

As is well known, the amplifier output section 54 includes a switching amplifier circuit for switching and amplifying a PWM signal and a low-pass filter for forming this amplified output as a sound signal waveform. The switching amplifier circuit can be configured so as to include, for example, an N-channel power MOS-FET capable of performing switching at a high voltage. For the low-pass filter, as is well known, an LC low-pass filter formed of an inductor and a capacitor is used.

In the amplifier output section 54, first, an amplification operation is performed in such a way that the switching amplifier circuit amplifies the PWM signal input from the PWM modulator 53 by performing switching in order to enable the PWM signal to pass through the low-pass filter. As a result, a driving current of the sound signal waveform flows through the speaker SP and, for example, sound is output from the speaker SP.

Figure 3:
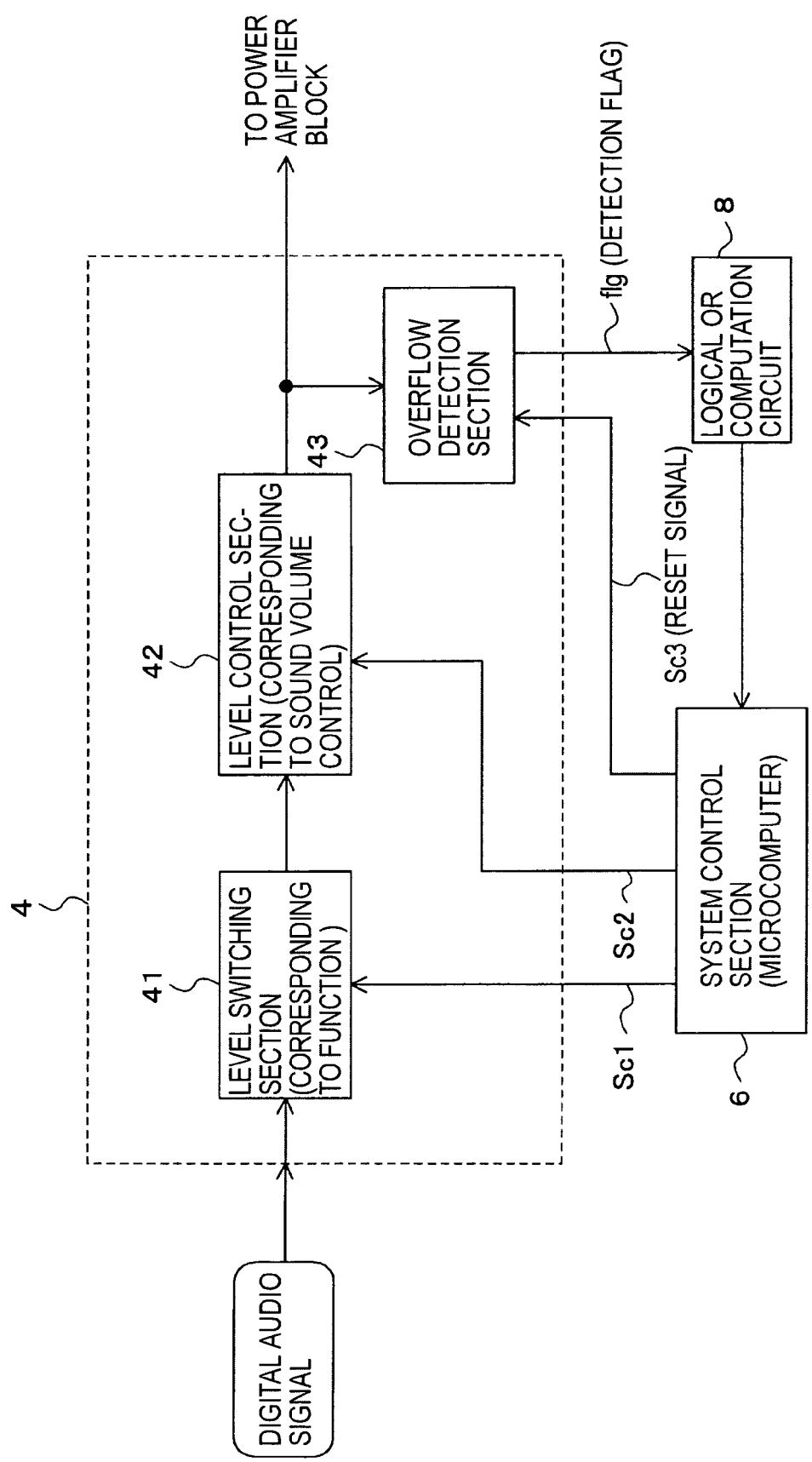
FIG. 3 is a block diagram showing parts related to sound volume varying as the internal configuration of a digital audio signal processing block.

In the block diagram of FIG. 3, as the internal configuration of the digital audio signal processing block 4, parts relating to sound volume varying with respect to output sound of a corresponding channel are mainly shown. In this case, as the parts relating to sound volume varying for the digital audio signal processing block 4, a level switching section 41 and a level control section 42 are provided. Furthermore, as will be described later, an overflow detection section 43 for sound volume control adaptable to the digital audio signal level after level control is provided. In FIG. 3, as parts other than the digital audio signal processing block 4, the system control section 6, the sound volume control 7a in the user interface section 7, and the logical OR computation circuit 8 are also shown. In FIG. 1, the illustration of the logical OR computation circuit 8 is omitted for the sake of description.

Both the level switching section 41 and the level control section 42 in the digital audio signal processing block 4 are parts relating to level varying, and as described hereinafter, conditions for level varying differ. Regarding the level varying, the level switching section 41 and the level control section 42 are in the relationship of the preceding stage and the subsequent stage. Therefore, the digital audio signal corresponding to a particular channel, which is output from the surround processing section 3, is input to the level switching section 41 earlier when the level of the signal is varied.

As described above with reference to FIG. 1, the digital audio signal as a sound source to be input and obtained by the sound source input section 1 is selected by the selector 2 and is output to the subsequent stage, with the result that the digital audio signal is finally output as sound. That is, the selection of the digital audio signal (that is, the sound source) in the selector 2 corresponds to a so-called function switching operation in the sound playback apparatus. That is, for the user, for example, in the case of the configuration shown in FIG. 1, a predetermined operation for switching the functions among a CD, a DVD, and an external input (an external analog audio signal) is performed on the user interface section 7. In response to this operation, the system control section 6 performs control so that the digital audio signal corresponding to the specified function (sound source) is selected and output in the selector 2.

Here, there are cases in which the level of the digital audio signal differs for each function. In a specific example, the signal level of an audio CD is 0 dB at a maximum, and the digital audio signal that originates from an external analog audio signal is generally lower than that level. In such a case where the signal level difference is greater to a certain degree or more, if the function is switched, a large difference occurs in the sound volume that is played back and output in response to this switching. This results in, for example, an inconvenience of being undesirable from a hearing point of view.

Accordingly, in the level switching section 41, the level switching is performed by shifting by a predetermined amount the audio signal level in accordance with the switched function so that the audio signal is corrected in such a manner that the difference in the audio signal level among the above-mentioned functions becomes less than a fixed value.

For example, since the audio signal level difference for each function is almost determined, the necessary shift level can be determined in advance in such a manner as to correspond to each function. Therefore, for example, the system control section 6 outputs a control signal Sc1 to the level switching section 41 in response to performing control for switching functions (that is, control for the selector 2), thereby instructing the shift of the signal level corresponding to the switched function. In the level switching section 41, the signal level corresponding to the instructions by the control signal Sc1 is set, and the input digital audio signal is level-shifted and output. In order to actually shift the level, for example, the level switching section 41 should perform processing for changing the gain setting in accordance with the level to be shifted. As a result of the level shift being performed in this manner, the playback sound volume corresponding to the switching of the function under the condition in which the sound volume by an operation using the sound volume control 7a is fixed can be made to fall within a fixed range.

The digital audio signal output from the level switching section 41 is subjected to predetermined signal processing as necessary and is input to the level control section 42 at a particular signal processing stage.

As a basic operation, the level control section 42 performs signal processing for increasing or decreasing the level (gain) of the input digital audio signal under the control of the system control section 6 in response to the sound volume up/down operation performed on the sound volume control 7a.

In particular, in this embodiment, the system control section 6 makes a predetermined conditional determination as to the level state of the digital audio signal output from the level control section 42. Then, under the control in accordance with this conditional determination result, the actual setting level in the level control section 42 is varied. This becomes sound volume control (sound volume correction control) for the purpose of preventing distortion from occurring in sound as a result of becoming an excessive input in response to the sound volume increasing more than a particular degree due to, for example, the operation on the sound volume control 7a. The system control section 6 performs level varying control in response to the operation on the sound volume control 7a and level varying control for sound volume correction control by outputting a control signal Sc2 to the level control section 42. That is, the control signal Sc2 indicates, for example, a step of increasing or decreasing the level. In response to this increasing or decreasing step indicated by the control signal Sc2, the level control section 42 performs a level varying process on the digital audio signal that is input.

In this case, the digital audio signal whose level is set by the level control section 42 is input to the power amplifier block 5. The actual configuration may be formed in such a way that, as necessary, some kind of a signal processing system is interposed between the output of the level control section 42 and the input of the power amplifier block 5.

Then, the digital audio signal, which becomes the output of the level control section 42 in this case (the input stage of the power amplifier block 5), is made to branch and input to the overflow detection section 43.

The overflow detection section 43 detects as to whether or not the digital audio signal input to the power amplifier block 5 overflows.

The overflow herein refers to the fact that the signal level becomes a so-called overflow as the result of the computation for the digital audio signal process. Therefore, when the digital audio signal in such an overflow is input to the power amplifier block 5, this results in an excessive input, and the output sound can become distorted. That is, in this embodiment, the detection as to whether or not a state is reached in which the audio signal to be input to the power amplifier block 5 becomes excessive and distortion occurs is performed by detecting as to whether or not the signal level is in an overflow state on the basis of the fact that the audio signal is in a digital format.

What should be noted here is that the overflow detection section 43 uses, as a detection target, the digital audio signal after level adjustment is performed by the level control section 42. Therefore, for the level state of the digital audio signal to be detected by the overflow detection section 43 (that is, whether or not the digital audio signal is in an overflow state), the level adjustment result in the level control section 42, corresponding to the sound volume operation on the sound volume control 7a, is reflected. That is, as the level control result in the level control section 42, there is the relationship leading to the fact that, when the sound volume level that is increased in response to the sound volume up operation on the sound volume control 7a becomes at a fixed level or higher, the overflow state is detected by the overflow detection section 43.

Then, when the overflow state is detected by the overflow detection section 43, a detection flag flg is set. The detection flag flg is input to the logical OR computation circuit 8. In the manner described next, the output of the detection flag flg from the overflow detection section 43 provided in the digital audio signal processing block 4 for each of a predetermined plurality of channels is input to the logical OR computation circuit 8. As will be described later, the system control section 6 makes a conditional determination as to the output of the logical OR computation circuit 8 on the basis of the computation result, and performs control for the level control section 42 so that level control for sound volume correction control is performed in accordance with the conditional determination result.

As the specification of the overflow detection section 43 in this embodiment, when the overflow state is detected once and the detection flag flg indicating this state is begun to be output, hereinafter, even if the state is no longer an overflow, the output of the detection flag flg indicating the overflow state is continued unless the flag is reset.

Accordingly, the system control section 6 can output a control signal Sc3 as a reset signal. The overflow detection section 43 resets the detection flag flg at a timing corresponding to the input of the control signal Sc3.

For example, in an IC as the digital audio signal processing block 4, the overflow detection section 43 should use parts provided to obtain the overflow detection result used for various kinds of processing to be performed in the digital audio signal processing block 4. In general, the detection of the overflow can be performed by referring to substantially the value of the bit one digit higher the highest-order bit, which is called a "carry" and the value of a borrow as the computation result of the digital signal processing. The overflow detection section 43 should be configured to adopt such a detection technique.

Figure 4:
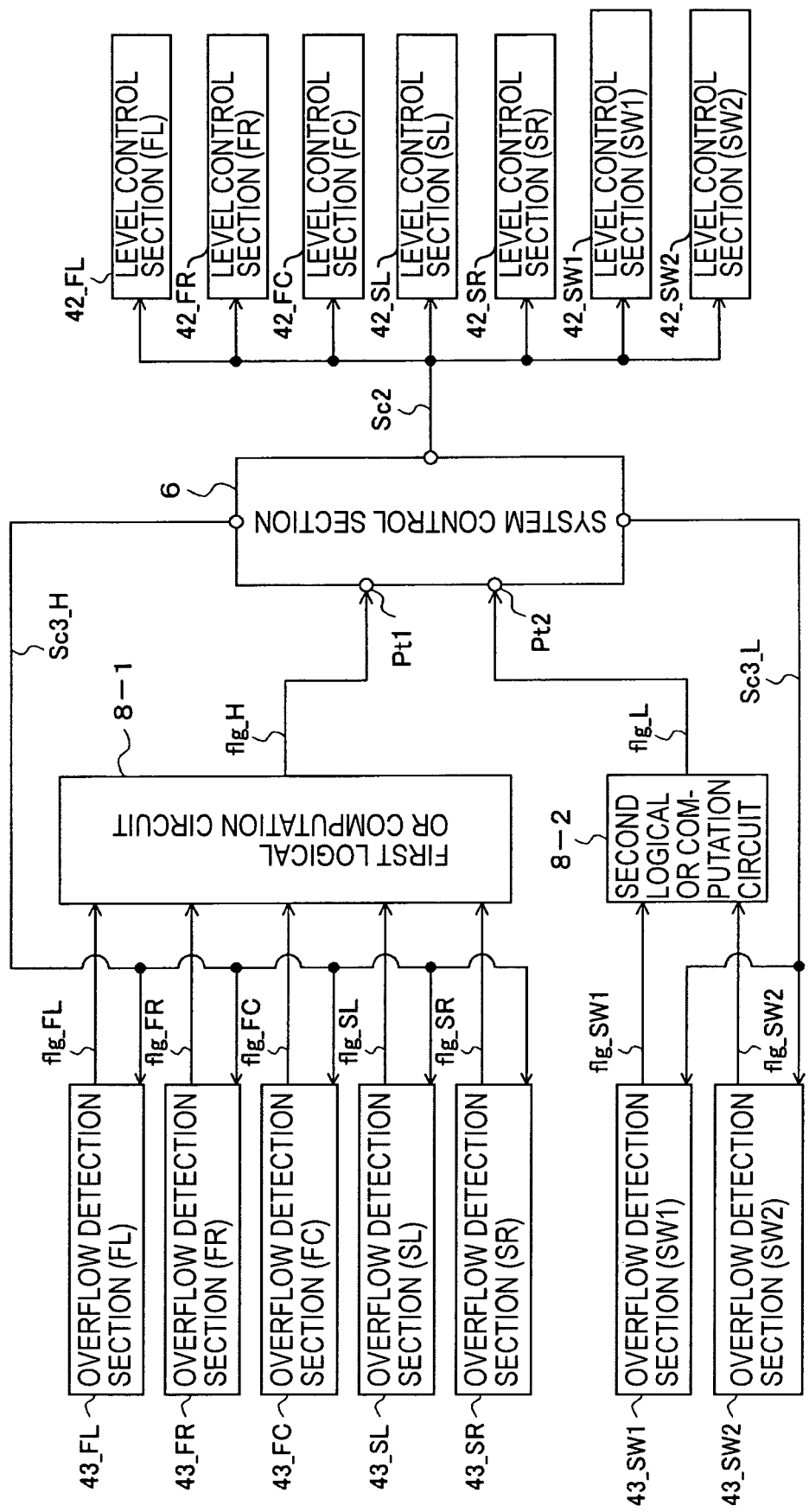
FIG. 4 is a block diagram showing the configuration of a sound volume correction control system in the sound playback apparatus according to the embodiment of the present invention.

FIG. 4 shows parts forming the overall configuration of a sound volume correction control system in the sound playback apparatus according to this embodiment.

In FIG. 4, a plurality of level control sections 42 and a plurality of overflow detection sections 43 are shown. As shown in FIG. 3, the level control section 42 and the overflow detection section 43 are provided in the digital audio signal processing block 4. The digital audio signal processing block 4 is provided so as to correspond to each channel. Therefore, each level control section 42 and each overflow detection section 43 are also provided so as to correspond to each channel. In correspondence with the above, in FIG. 4, level control sections (42_FL, 42_FR, 42_FC, 42_SL, 42_SR, 42_SW1, and 42_SW2) for each channel and overflow detection sections (43_FL, 43_FR, 43_FC, 43_SL, 43_SR, 43_SW1, and 43_SW2) for each channel are shown so as to correspond to each of the seven channels (FL, FR, FC, SL, SR, SW1, and SW2).

As the logical OR computation circuit 8 shown in FIG. 3 above, in practice, a first logical OR computation circuit 8-1 and a second logical OR computation circuit 82 are provided, as shown in FIG. 4.

In this case, the first logical OR computation circuit 8-1 and the second logical OR computation circuit 82 correspond to a full-range channel and a subwoofer channel, respectively.

More specifically, first, detection flags (flg_FL, flg_FR, flg_FC, flg_SL, and flg_SR) that are output from the overflow detection sections (43_FL, 43_FR, 43_FC, 43_SL, and 43_SR) corresponding to a full-range channel group (FL, FR, FC, SL, and SR), respectively, are input to the first logical OR computation circuit 8-1.

In the first logical OR computation circuit 8-1, an output obtained by computing the logical OR of the detection flags (flg_FL, flg_FR, flg_FC, flg_SL, and flg_SR) is output, as a detection flag flg_H to be read by the system control section 6 side, to a detection input port Pt1 of the system control section 6.

Detection flags (flg_SW1 and flg_SW2) output from the overflow detection sections (43_SW1 and 43_SW2) corresponding to the remaining subwoofer channel group (SW1 and SW2) respectively are input to the second logical OR computation circuit 82. The second logical OR computation circuit 82 outputs an output obtained by computing the logical OR of the detection flags (flg_SW1 and flg_SW2), as a detection flag flg_L to be read by the system control section 6 side, to a detection input port Pt2 of the system control section 6.

As a result of the above, the detection flag flg_H corresponds to the full-range channel group, and the detection flag flg_L corresponds to the subwoofer channel group. By scanning and receiving the detection input ports Pt1 and Pt2 with respect to the detection flags flg_H and flg_L, it is possible for the system control section 6 to recognize the flag state.

In this case, the overflow detection sections (43_FL, 43_FR, 43_FC, 43_SL, and 43_SR) corresponding to the full-range channel group each output "0" (L level) in a state in which an overflow is not detected and switches to the output of "1" (H level) in response to the detection of the overflow state. This applies the same for the overflow detection sections (43_SW1 and 43_SW2) corresponding to the subwoofer channel group.

Therefore, the first logical OR computation circuit 8-1 operates so as to switch the detection flag flg_H, which is a computation output, from an output of "0" to an output of "1" in response to the detection of the overflow state by the overflow detection section 43 in at least one of the channels forming the full-range channel group (FL, FR, FC, SL, and SR).

Similarly, in the second logical OR computation circuit 82, the detection flag flg_L, which is a computation output, is switched from an output of "0" to an output of "1" in response to the determination of the overflow state by the overflow detection section 43 in at least one of the subwoofer channels (SW1 and SW2).

The system control section 6 in this case scans the detection input ports Pt1 and Pt2 at intervals of 50 msec. That is, the detection flags flg_H and flg_L are read at intervals of 50 msec.

Each time the detection flag flg_H is read, the system control section 6 outputs a control signal (reset signal) Sc3_H at a timing, for example, immediately after that reading. As shown in FIG. 4, the control signal (reset signal) Sc3_H is made to branch from one output port of the system control section 6 and input to the overflow detection sections (43_FL, 43_FR, 43_FC, 43_SL, and 43_SR). Therefore, the overflow detection sections (43_FL, 43_FR, 43_FC, 43_SL, and 43_SR) are reset at a coincident timing in response to the output of the control signal (reset signal) Sc3_H.

Similarly, each time the detection flag flg_L is read, the system control section 6 outputs a control signal (reset signal) Sc3_L, for example, at a timing immediately after that reading. Since the control signal (reset signal) Sc3_L is also made to branch from one output port of the system control section 6 and input to the overflow detection sections (43_SW1 and 43_SW2), the overflow detection sections (43_SW1 and 43_SW2) are reset at the coincident timing in response to the output of the control signal (reset signal) Sc3_L.

In this case, the control signal Sc2 output from the system control section 6 in order to perform level varying control for the level control section 42 is made to branch from one output port of the system control section 6 and input to all the level control sections (42_FL, 42_FR, 42_FC, 42_SL, 42_SR, 42_SW1, and 42_SW2). Therefore, the level control by the control signal Sc2 is performed commonly for each channel. This means that the level control of the audio signal by the control signal Sc2, that is, the level control according to the operation performed on the sound volume control 7a and the level control for sound volume correction control, varies the sound volume of the entire surround sound by the output sound from the speakers (SP_FL, SP_FR, SP_FC, SP_SL, SP_SR, SP_SW1, and SP_SW2) in the manner described above.

Although not shown in FIG. 4, for example, a configuration capable of independently varying the sound volume (the audio signal level) of individual channels for the purpose of obtaining sound volume balance among the channels needs to be installed in practice.

On the assumption of the configuration of the sound volume control system shown in FIG. 4 above, a description is given below of an algorithm for sound volume correction control performed by the system control section 6.

Initially, when the system control section 6 performs level control on the level control section 42, the system control section 6 indicates, to the level control section 42, a signal level to be provided to the digital audio signal. The processing for determining this signal level is described below.

Figure 5:
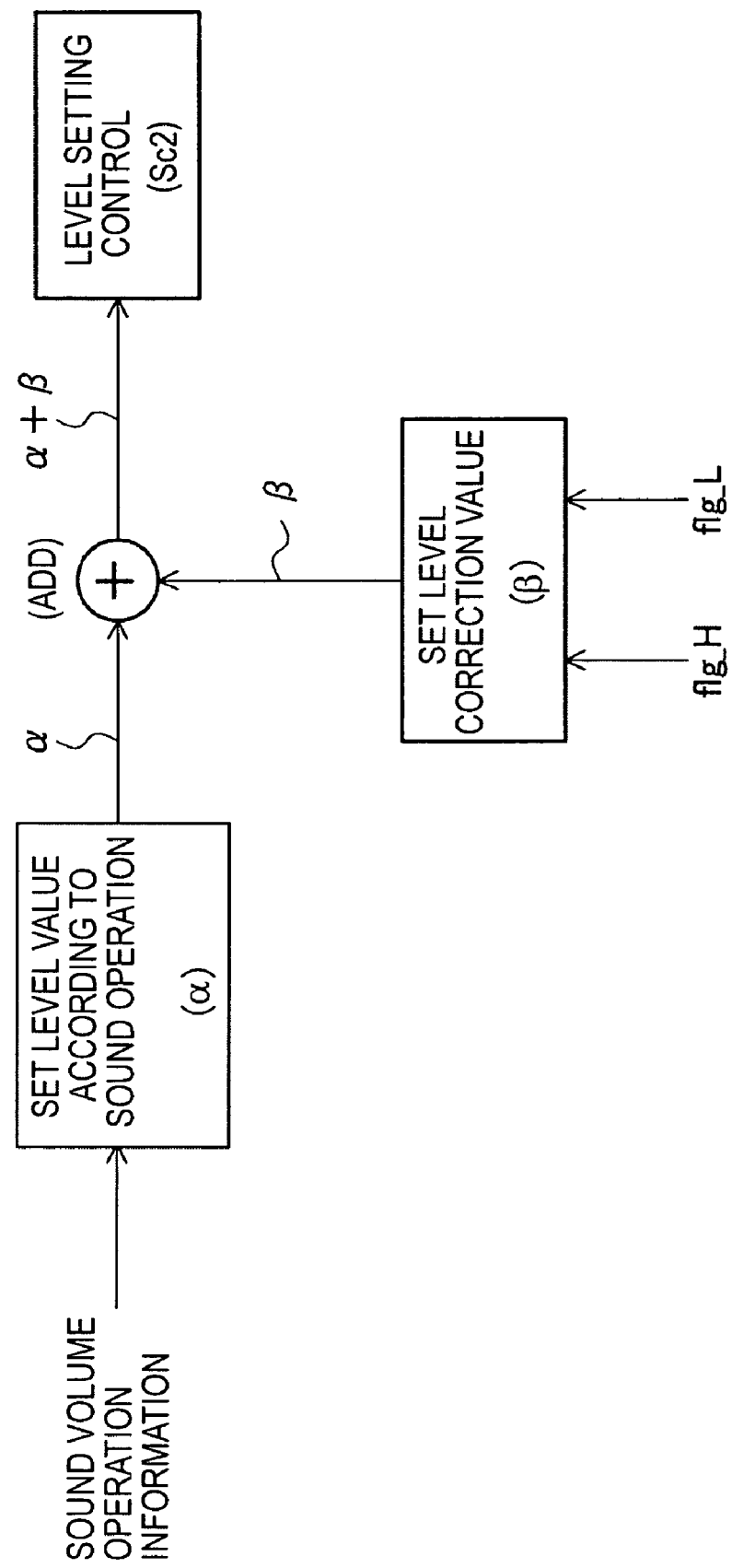
FIG. 5 is a schematic view showing the processing procedure of sound volume correction control in the embodiment of the present invention.

FIG. 5 is a schematic view showing the processing for determining a signal level by the system control section 6.

In the system control section 6, first, the level value corresponding to the sound volume operation is set. For the processing for setting the level value corresponding to the sound volume operation, in response to only the operation performed on the sound volume control 7a, that is, based on only the sound volume operation information obtained in response to the operation on the sound volume control 7a, the level value $\alpha$ corresponding to the sound volume operation, the level value of which should be set by the level control section 42, is determined.

Based on the level of the digital audio signal output from the level control section 42 in practice, that is, based on the detection flags flg_H and flg_L described with reference to FIG. 4 above, the system control section 6 sets a level correction value $\beta$ (level correction information) corresponding to the amount of correction for level correction.

In the system control section 6, for the level value $\alpha$ corresponding to the sound volume operation and the level correction value $\beta$ obtained in this manner, the level correction value $\beta$ is added to the level value $\alpha$ corresponding to the sound volume operation in order to obtain a control signal level value ($\alpha+\beta$). Then, the control signal Sc2 is output so that the digital audio signal is output according to the control signal level value ($\alpha+\beta$), and the level control section 42 is controlled.

In this embodiment, when the system control section 6 determines the level correction value $\beta$ for sound volume correction control in the manner shown in FIG. 5 above, a first condition and a second condition are defined with respect to the state of the audio signal level (that is, corresponds to the sound volume to be played back and output) output from the level control section 42.

As can be understood from the following description, in response to the fact that the first condition is satisfied, the absolute value of the level correction value $\beta$ at that time is increased by a predetermined unit amount, and in response to the fact that the second condition is satisfied, the absolute value of the level correction value $\beta$ at that time is decreased by a predetermined unit amount.

Figure 6:
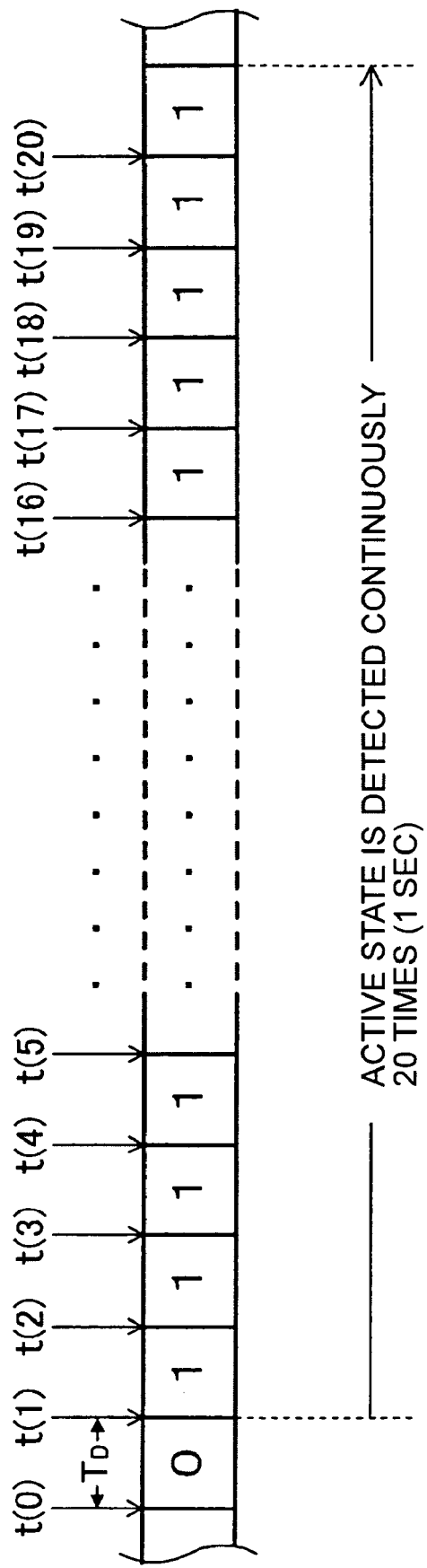
FIG. 6 illustrates requirements for satisfying a first condition.
Figure 7:
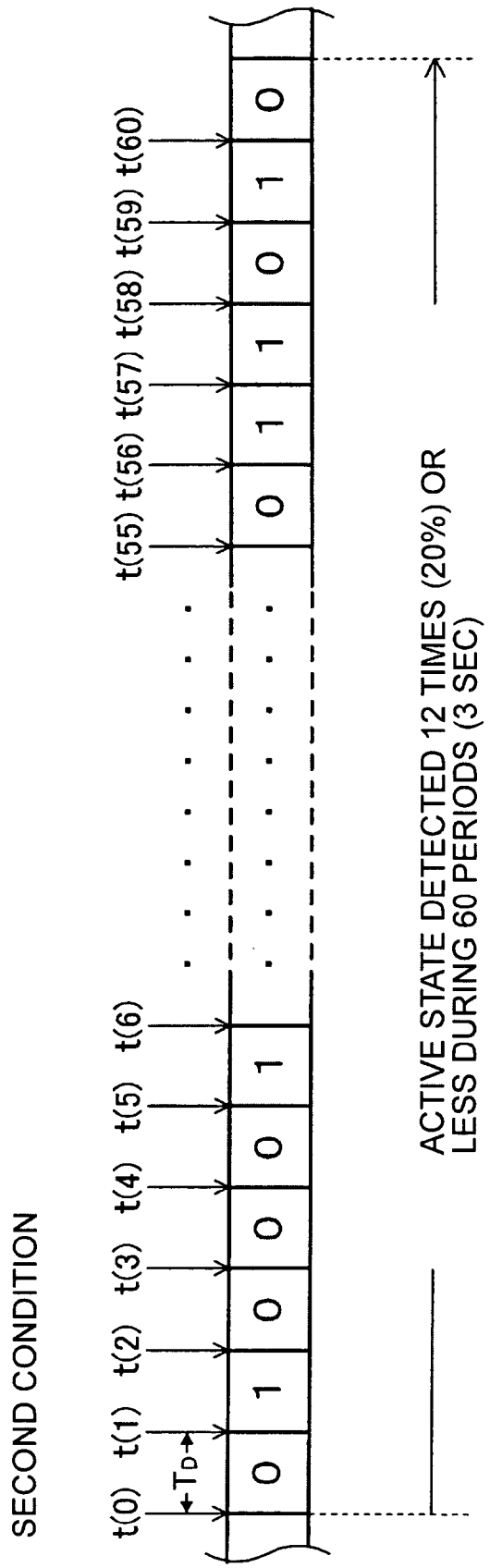
FIG. 7 illustrates requirements for satisfying a second condition.

Then, a determination as to whether or not the first condition and the second condition are satisfied (held) is made on the basis of the read results of the detection flags flg_H and flg_L, as shown in, for example, FIGS. 6 and 7.

Initially, the first condition is satisfied when the state shown in FIG. 6 is obtained with respect to at least one of the read result of the detection flag flg_H and the read result of the detection flg_L.

As described above with reference to FIG. 4, the system control section 6 scans the detection input port Pt1 at intervals of 50 msec in order to read the detection flag flg_H and resets the overflow detection sections (43_FL, 43_FR, 43_FC, 43_SL, and 43_SR) corresponding to the full-range channel group at a timing immediately after that reading. Similarly, the system control section 6 scans the detection input port Pt2 at intervals of 50 msec in order to read the detection flag flg_L and resets the overflow detection sections (43_SW1 and 43_SW2) corresponding to the subwoofer channel group at a timing immediately after that reading.

In FIG. 6, the reading of the detection flags flg_H and flg_L and the timing of resetting the overflow detection section 43, which is performed immediately after that reading, are shown as being coincident as time t(n). In this case, the period TD represented by time t(n)−time t(n+1), which is before and after in relation to time t(n), has a time width of 50 msec.

Then, the value of the detection flag flg_H or flg_L, which is read at each time t(n), is indicated by "0" or "1".

Here, in order to simplify and facilitate the understanding of the description, it is assumed that the read result shown in FIG. 6 is a read result of the detection flag flg_H corresponding to the full-range channel group.

In FIG. 6, it is assumed that, at the timing of time t(0), "0" is read as the value of the detection flag flg_H and, at time t(1) 50 msec thereafter, the read value changes to "1". Then, at each timing of subsequent time t(2) to time t(20), all the read values are assumed to be "1". As can be understood from the description up to this point, the state in which the read value of the detection flag flg_H is "1" indicates that the audio signal level in at least one of the channels is in an overflow state in the full-range channel group. Such a state will be hereinafter referred to as an "active state".

As the read result shown in FIG. 6, since the read result of the detection flag flg_H is "1" continuously 20 times starting from time t(1) until time t(20), the fact that the state is active is detected continuously 20 times. Based on the fact that the interval at time t(n) is 50 msec, this indicates that, an active state is obtained continuously for one second. Such a state satisfies the first condition.

Also, the first condition is satisfied when the read result shown in FIG. 6 is obtained with respect to the detection flag flg_L.

That is, the first condition in the embodiment is, strictly speaking, that "at least one of the read result of the detection flag flg_H corresponding to the full-range channel group and the read result of the detection flag flg_L corresponding to the subwoofer channel group is in an active state continuously for one second".

Since the overflow detection section 43 is reset each time the detection flag (flg_H or flg_L) is read, strictly speaking, in the detection method shown in FIG. 6, there are cases in which it cannot always be said that the active state continues for one second. That is, during the time from when the value of the detection flag (flg_H or flg_L) is reset at time t(n) until reading is performed at the next time t(n+1), there may be cases in which the active state is once reset and an active state is reached again. However, in this embodiment, if the active state is detected continuously as a result of the reading at intervals of 50 msec, it is assumed that the active state continues. The reason for this is that the level state of the audio signal that is detected to be an active state continuously by the reading at intervals of 50 msec may be substantially assumed to be identical to that the active state continues actually during the period of 50 msec.

The meaning that the first condition is satisfied is as follows.

First, the detection flag flg_H becomes the logical OR of a plurality of detection flags (flg_FL, flg_FR, flg_FC, flg_SL, and flg_SR) corresponding to the full-range channel group (FL, FR, FC, SL, and SR), respectively. Therefore, in a case where, as shown in FIG. 6, the active state is obtained continuously 20 times as the read results of the detection flag flg_H, it may be said that the active state for each time is obtained if the detection flag flg corresponding one or more channels is "1". Furthermore, even if the detection flag flg corresponding to one specific channel does not continue to output "1", if the detection flag flg corresponding to one of the other channels is "1", it may be said that the result such that the active state continues 20 times is obtained.

Based on the foregoing, the determination as to the first condition based on the detection flag flg_H may be said to determine whether or not the signal level is in an active state as the overall tendency of the full-range channel group rather than the individual channels of the full-range channel group (FL, FR, FC, SL, and SR).

In other words, in order to make a determination as to whether or not the signal level is in an active state as the entire full-range channel group, first, the logical OR of the detection flags flg corresponding to each of the channels forming the full-range channel group is computed. Furthermore, for making a conditional determination, a comparatively long detection period (a larger number of detections) of, for example, one second (20 times) is set.

The foregoing also applies the same to the subwoofer channel group. That is, the fact that the read result of the detection flag flg_L satisfies the first condition indicates that the tendency of the entire subwoofer channel group is in an active state.

The first condition is satisfied if the active state continues for one second with respect to at least one of the read result of the detection flag flg_H and the read result of the detection flag flg_L. This results in that the determination as to whether or not the first condition is satisfied leads to a determination as to whether or not the overall tendency of the surround sound is in an active state in a collective manner with respect to the full-range channel group and the subwoofer channel group. Then, as also described above, being in an active state is a state in which an overflow occurs with respect to the audio signal level of at least one channel, that is, distortion due to an excessive level occurs.

The foregoing means that, when the configuration of the multi-channel is adopted as in this embodiment, the state in which the first condition is satisfied is a state in which distortion due to an excessive level occurs as the tendency when viewed as the entire surround sound.

With respect to both the read result of the detection flag flg_H and the read result of the detection flag flg_L, the fact that the active state continues for one second is defined as satisfying the first condition. Then, for example, the signal level of a particular channel on the full-range channel group side is excessive, and the sound volume needs to be corrected. In spite of this fact, since the signal level on the subwoofer channel side is within the appropriate range, an inconvenience of the sound volume correction control not working as the entire surround sound occurs. Conversely, whereas the signal level is an appropriate signal level for the full-range channel group side, when the signal level overflows on the subwoofer channel group side, a similar inconvenience occurs.

FIG. 7 show a read result of the detection flags flg_H and flg_L when a second condition is satisfied (held).

Also, in FIG. 7, time t(n) is a timing for reading a detection flag at intervals of 50 msec and for resetting the overflow detection section 43.

In FIG. 7, as the results of the detection flag flg_H (flg_L) read continuously at 60 times from time t(0) to time t(60), the results are shown in which the number of times the value "1" of the detection flag flg_H (flg_L) indicating an active state is less than or equal to 12, which corresponds to 20% of the 60 times. When such read results are viewed with respect to time, the result is shown in which the total time in which the signal level is in an active state in three seconds (=50 msec×60) is less than or equal to 600 msec (=50 msec×12) corresponding to 20% of three seconds.

That is, as the read result of the detection flag flg_H (flg_L) according to a particular number of continuous unit times (unit time), the result is shown in which the number of times (total time) in which a detection value indicating the active state is obtained is 20% or less with respect to the number of unit times (unit time).

In this embodiment, the second condition is satisfied when the read result shown in FIG. 7 is obtained with respect to both the detection flag flg_H and the detection flag flg_L.

As described above, the state in which the total time of reaching the active state per unit time is 20% or less is, in other words, a state in which the total time of the non-active state is 80% or more. Such a state is handled as corresponding to a safe sound volume state in which, although a state in which the digital audio signal becomes an overflow occurs within a particular fixed value, it is guarantied with a particular margin that distortion of sound that deteriorates the sound quality from a hearing point of view does not occur, and also, a power amplifier, a speaker, etc., are not destroyed.

The fact that the read result shown in FIG. 7 corresponding to such a state is obtained first with respect to the detection flag flg_H indicates that the tendency of the entire sound of the full-range channel group (FL, FR, FC, SL, and SR) is in the above-described safe sound volume state. Similarly, if the read result shown in FIG. 7 is obtained with respect to the detection flag flg_L, this indicates that the tendency of the entire sound of the subwoofer channel group (SW1 and SW2) is in the above-described safe sound volume state. Therefore, in the state in which the second condition is satisfied, which is the read result shown in FIG. 7 with respect to both the detection flags flg_H and flg_L, a safe sound volume state is obtained with respect to both the full-range channel group and the subwoofer channel group.

In this embodiment, the reason for setting the timing of the reading of the detection flags flg_H and flg_L (and the resetting of the overflow detection section 43) to 50 msec is due to the fact that, for example, the processing performance of the microcomputer forming the system control section 6, a determination period, for example, one second or three seconds, for obtaining the determination results of the first condition and the second condition described with reference to FIGS. 6 and 7, and the number of samples (the number of readings) of the detection flags flg_H and flg_L, which is assumed to be sufficient for obtaining the reliability of the determination results in this determination period are taken into consideration.

Figure 8:
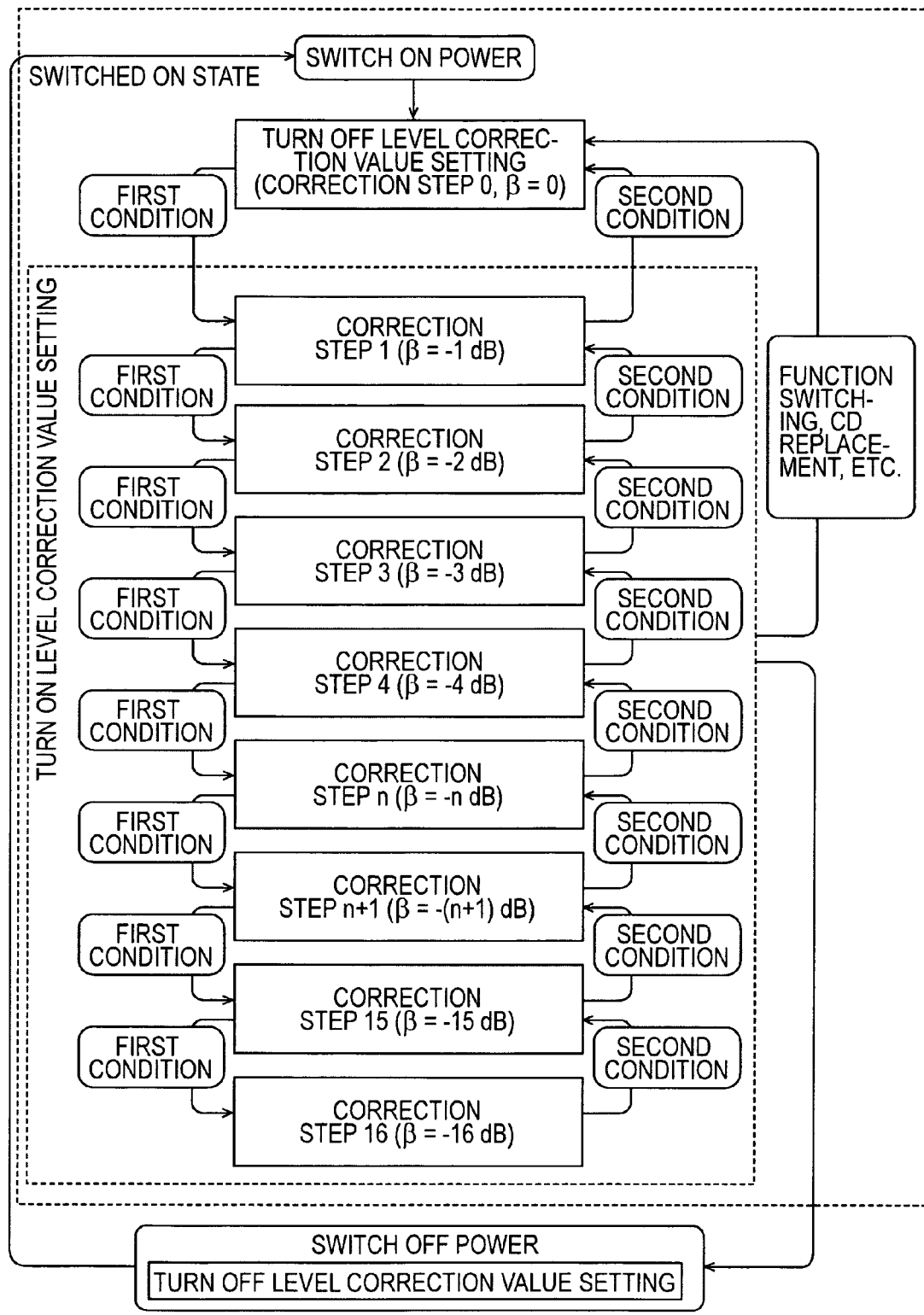
FIG. 8 is a schematic view showing state transitions in sound volume correction control (transitions of correction steps)

FIG. 8 is a schematic view showing a process for determining a level correction value β in accordance with the determination results with respect to the first condition and the second condition, that is, state transitions in sound volume correction control.

Initially, when the main power supply of the sound playback apparatus according to this embodiment is changed from an off state to an on state, "off" is set for the level correction value setting operation. Therefore, the level correction value β at this time is set to 0. Furthermore, when the state in which the level correction value setting operation is off is viewed as one stage of the correction step to be described next, it can be assumed that the correction step is in the stage of "correction level 0".

However, after the main power supply is switched on, level control on the level control section 42 is performed in response to the operation on the sound volume control 7a. That is, based on the sound volume operation information input in response to the operation on the sound volume control 7a, the system control section 6 sets the level value a corresponding to the sound volume operation shown in FIG. 5, and performs level setting control on the level control section 42.

At this stage, since the level correction value β=0, substantially based on the step value a corresponding to the operation, the system control section 6 performs level setting control on the level control section 42. That is, at this time, level varying in the level control section 42 is performed in such a manner that the operation on the sound volume control 7a is directly reflected. Also, the sound volume change of the output sound volume corresponds to the operation itself on the sound volume control 7a.

Then, in the state in which, for example, the level correction value setting is off in the manner described above, if the first condition described with reference to FIG. 7 is satisfied, control proceeds to correction step 1. In this case, correction steps of 17 stages, that is, correction step 0 (in which the level correction value setting operation is off) to correction step 16, are provided. The 16-stage steps from correction step 1 to correction step 16 are steps in which the level correction value setting is set on, and sound volume correction control becomes effective actually.

Here, the level correction value β and the level value α corresponding to the sound volume operation take a value in dB units. In correction step 1, −1 dB is set as the level correction value β. If this is made to correspond to the description of FIG. 5, the controlling signal level value (α+β) becomes (α−1) dB. As a result of the system control section 6 performing level control in accordance with the controlling signal level value, a digital audio signal whose level is reduced (attenuated) by 1 dB with respect to the original audio signal level set in response to the sound volume operation is output from the level control section 42.

When the first condition is satisfied while sound volume correction control in correction step 1 is being performed, the process proceeds to correction step 2.

In this embodiment, −1 dB is set as the amount of change (the amount of unit correction) of the level correction value β corresponding to the transition for each step of the correction step. Then, when the process proceeds from correction step 1 to correction step 2, by further adding −1 dB to the level correction value β=−1 dB corresponding to correction step 1, a level correction value β=−2 dB is newly set. Level control is performed in accordance with the controlling signal level value (α−2 dB) obtained on the basis of the level correction value β=−2 dB set in correction step 2 in this manner. As a result, a digital audio signal whose level is reduced (attenuated) by 2 dB with respect to the original audio signal level, which is set in response to the sound volume operation, is output from the level control section 42.

Then, in the state in which the sound volume correction control is performed in correction step 2, when the first condition is satisfied, the process proceeds to the next correction step 3. In correction step 3, by further adding −1 dB to the level correction value β=−2 dB, which is set in the correction step 2, the level correction value β is set to −3 dB.

If the first condition is satisfied in the control state in correction step 3, the process proceeds to correction step 4. In this step, similarly, the level correction value β is set to −4 dB by adding −1 dB to the level correction value β=−3 dB, which is set in correction step 3.

In correction step 4 and subsequent steps, also, similarly, if the first condition is satisfied in the control state in correction step n (n is a natural number, and n=1 to 16 in this case) at that time, the state transitions to the next correction step n+1, which is one step after. Each time the correction step number increases by one step, the setting of the level correction value β is changed by adding thereto −1 dB, which is the amount of unit correction. This means that, the more the correction step proceeds, the stronger the attenuation effect for the original audio signal level to be set in response to the sound volume operation becomes.

In this embodiment, steps are changed up to correction step 16 at a maximum. In correction step 16, the level correction value β=−16 dB. The amount of level correction in correction step 16 at the final stage among the correction steps 1 to 16 is at a maximum.

For example, in the control state in correction step 16 of this final stage, even if the first condition is satisfied, since there are no further steps, the control state in correction step 16 is maintained.

However, the level correction value corresponding to correction step 16 at this final stage is set so that, even if an operation is performed on the sound volume control 7a for the purpose of producing a maximum sound volume, the following is guaranteed that distortion is not recognized as the deterioration of sound quality from a hearing point of view and an excessive input state that might destroy circuits and the speaker is not reached.

Furthermore, it is assumed that the second condition is satisfied in the control state of correction step 16 of the final stage. In this case, the process returns to correction step 15, which is one step before. If the second condition is further satisfied in the control state of correction step 15, the process returns to correction step 14, which is one step before.

The same applies to correction step 14 and subsequent steps. When the second condition is satisfied in the control state in correction step n at that time, the process proceeds to correction step n−1, which is one step before that. In consequence with this, the level correction value β is decreased by 1 dB as a result of being changed to be set to decrease by −1 dB, and the level attenuation effect is weakened in a step-wise manner.

Finally, when the second condition is satisfied in the control state of correction step 1 and the process proceeds to the state in which the level correction value setting is off, the level correction value β becomes 0, and the process returns to a state in which level correction is not performed.

Even if the second condition is satisfied in the state in which the level correction value setting is off, the state in which the level correction is not performed is maintained without making corrections, for example, in a tendency of increasing the level.

As described above, in this embodiment, the correction step transitions for each step as the control state for sound volume correction control according to the first condition and the second condition. In response to the correction step transitioning for each step in this manner, the level correction value β is newly set in such a manner that the amount of unit correction (1 dB) is added or subtracted.

In the state transitions of sound volume correction control in this embodiment, the following patterns are also shown in FIG. 8.

First, when the function (sound source) is switched or the function is a CD playback, if a CD is replaced, the process proceeds to a state in which the operation of level correction value setting is off regardless of the stage number of the correction step up to this point.

When the function is switched or a CD is replaced, there are cases in which the level of the sound source itself differs before and after that switching or replacement. In such a case, also after the function is switched or the CD is replaced, if the correction step before the function is switched or the CD is replaced is effective, an inconvenience of being played back and output at a small sound more than necessary occurs. Accordingly, in the manner described above, an initial state is set in such a manner that the operation of the level correction value setting is off so as to deal with the case where the function is switched or the CD is replaced, the above-described inconvenience can be avoided.

When the main power supply is switched off, for example, the operation is stopped as a result of the power not being supplied to the level control section 42. That is, substantially, the operation of the level correction value setting becomes off (correction step 0).

In the algorithm shown in FIG. 8, when the level correction value is actually set, the number of steps is 16, that is, correction step 1 to correction step 16, and the amount of level correction corresponding to each step is 1 dB. This corresponds to the level setting of the sound source, represented by the digital audio signal recorded on, for example, a CD.

That is, in general, the digital audio signal recorded on a CD, etc., in the manner described above is set to 0 dB at a maximum level. However, if the digital audio signal is played back and output while remaining at this level, the level at which the digital audio signal is actually output as sound becomes lower. Therefore, in practice, the digital audio signal is often played back and output after the level is shifted to be higher by providing a fixed gain. In actuality of this embodiment, when a sound source, including a CD, in which 0 dB is set as the maximum level, is selected as a function, for example, the level switching section 41 shown in FIG. 3 performs a level shift of 15 dB. Therefore, for the level correction in this case, in correspondence with the above, a level reduction by −16 dB at a maximum is performed, so that a safe correction state is reliably obtained in a state in which the sound volume correction in correction step (16) at a maximum is performed. Furthermore, based on the fact that the attenuation of natural output sound from a hearing point of view when sound volume correction control is applied is obtained and based on the fact that the amount of unit correction of the level corresponding to the stage of the correction step is fixed at 1 dB by considering the balance of the simplicity of a control algorithm, a division of 16 stages from correction step 1 to correction step 16 is made in such a manner as to correspond to −1 db to −16 db.

Therefore, the number of level correction stages shown in FIG. 8 and the amount of level correction corresponding to the stage transition may be changed as appropriate according to the actuality.

Figure 9:
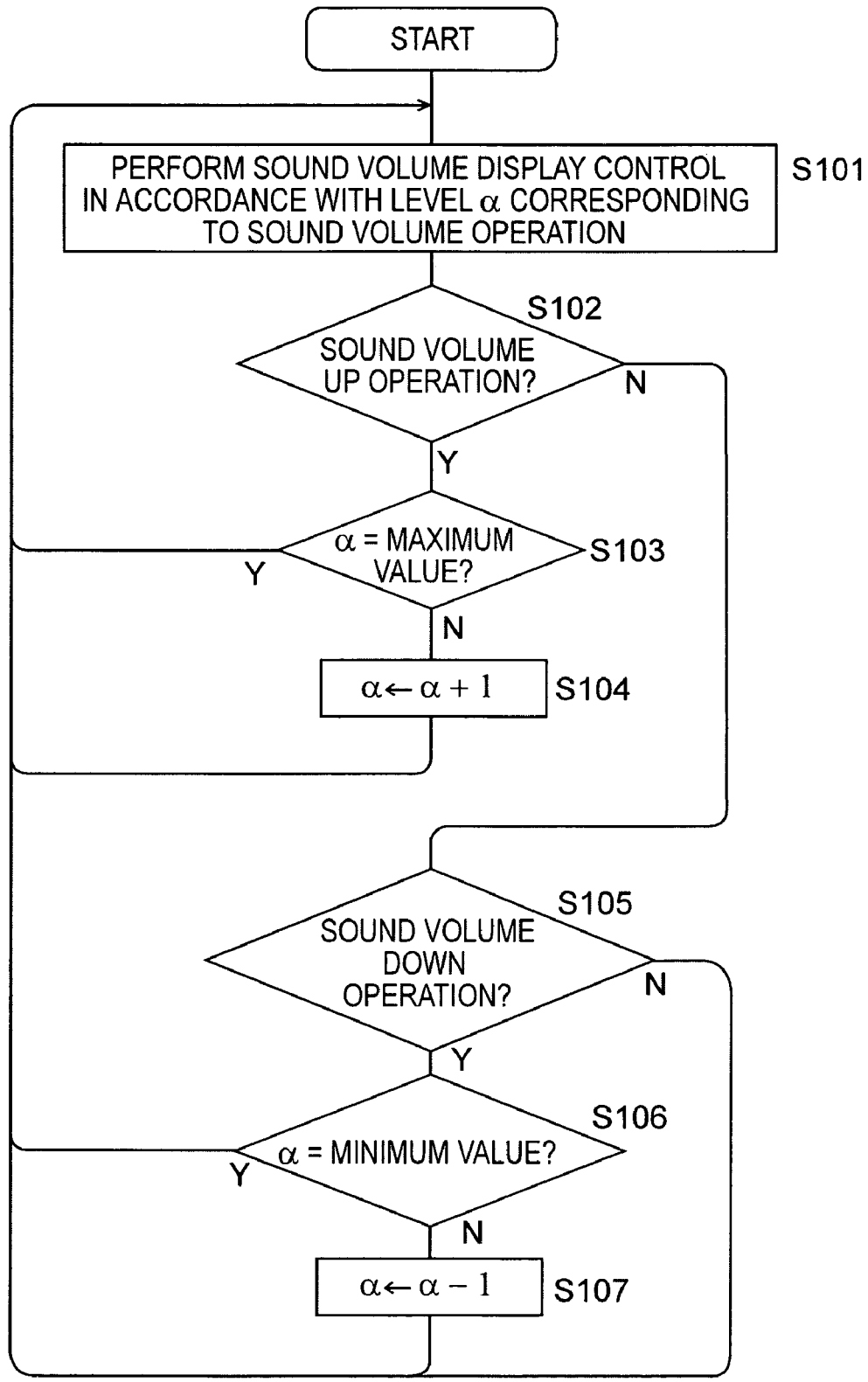
FIG. 9 is a flowchart showing the processing operation performed by a system control section in response to a sound volume operation.
Figure 10:
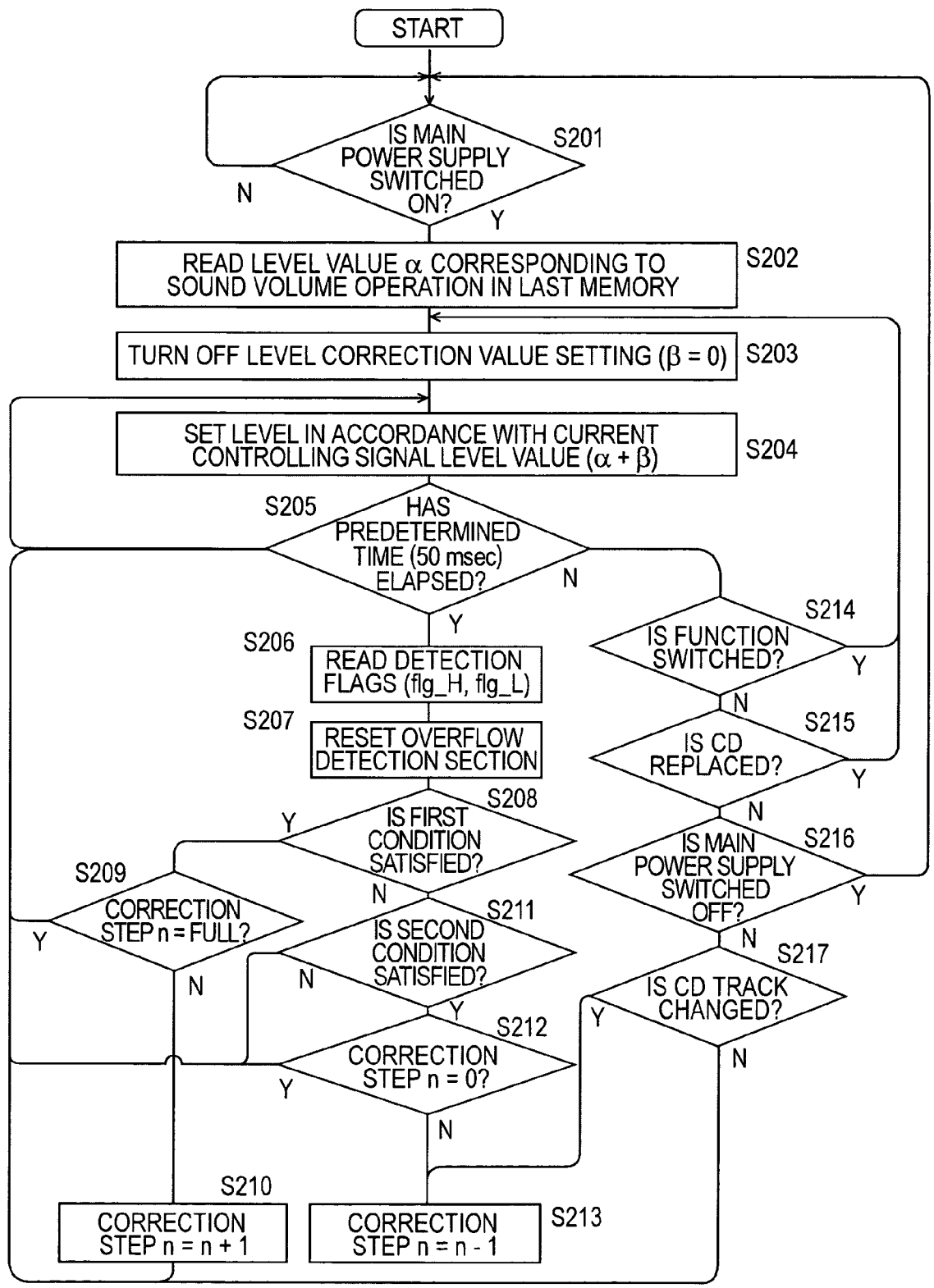
FIG. 10 is a flowchart showing the processing operation performed by the system control section with respect to the entire sound volume control.

Next, a description is given, with reference to the flow-charts in FIGS. 9 and 10, of a processing operation to be performed by the system control section 6 with respect to sound volume control including sound volume correction control (level correction value determination process) shown in FIG. 8 above. The processing shown in these figures is implemented by a CPU executing processing in accordance with a program stored in, for example, a ROM in the system control section 6.

Initially, in the system control section 6, processing shown in FIG. 9 is performed in response to an operation performed on the sound volume control 7a. The processing shown in FIG. 9 needs to be performed cyclically in a state in which, for example, the main power supply is switched on.

In the processing shown in FIG. 9, in step S101, display control for displaying a sound volume is performed according to the current level value $\alpha$ corresponding to the sound volume operation.

In other words, this means that, even if the actual sound volume (corresponding to $\alpha+\square$) changes as a result of the level correction value $\beta$ being changed in consequence of the change of the correction step, this change is not reflected in the sound volume display. That is, the sound volume display changes only in response to the operation on the sound volume control 7a by the user, and even if the actual sound volume changes in consequence of the change of the correction step, the level indicated by the sound volume display is not changed.

In the next step S102, a determination is made as to whether or not an operation for turning up (increasing) the sound volume is performed as an operation on the sound volume control 7a. When a negative result is obtained in step S102 by determining that the operation for turning up the sound volume is not performed, in step S104, a determination is made as to whether or not an operation for tuning down (decreasing) the sound volume is performed.

Here, when the operation for turning up the sound volume is performed on the sound volume control 7a, for example, the user interface section 7 in this embodiment transmits a command for requesting the level up of the audio signal for each step to the system control section 6 according to the number of operations and the operation continuation time. Also, when the operation for tuning down the sound volume is performed on the sound volume control 7a, the user interface section 7 transmits a command for requesting the level down of the audio signal for each step to the system control section 6 according to the number of operations and the operation continuation time.

In step S102, it is assumed that each time the command for requesting the level up of the audio signal by one step is received, an affirmative result is obtained. If the affirmative result is obtained in step S102, in step S103, the system control section 6 makes a determination as to whether or not the currently set level value $\alpha$ corresponding to the sound volume operation is a maximum value.

In step S103, when the affirmative determination result is obtained by determining that the currently set level value $\alpha$ corresponding to the sound volume operation is a maximum value, the process of step S104 to be described next is skipped, and the process returns to step S101. As a result, the sound volume level set in such a manner as to correspond to the sound volume operation is kept at a maximum and is not changed, and also, the sound volume level indicated by the sound volume display is kept at a maximum and is not changed.

On the other hand, when a negative determination result is obtained in step S103 by determining that the current level value $\alpha$ corresponding to the sound volume operation is not a maximum value, the process proceeds to step S104, whereby the currently set level value $\alpha$ corresponding to the sound volume operation is incremented by 1, and the process returns to step S101.

Similarly, in step S105 it is assumed that each time the command for requesting the level down of the audio signal by one step is received, an affirmative result is obtained. If an affirmative result is obtained in step S105, the system control section 6 makes a determination as to whether or not the currently set level value $\alpha$ corresponding to the sound volume operation is a minimum value.

When an affirmative determination result is obtained in step S106 by determining that the currently set level value $\alpha$ corresponding to the sound volume operation is a minimum value, step S107 is skipped, and the process directly returns to step S101. On the other hand, when a negative determination result is obtained in step S106, the process proceeds to step S107, whereby the currently set level value $\alpha$ corresponding to the sound volume operation is decremented by 1, and the process returns to step S101. When the process of step S107 is undergone, the sound volume level set in such a manner as to correspond to the sound volume operation is kept at a minimum and is not changed, and also, the sound volume level indicated by the sound volume display is kept at a minimum and is not changed.

According to such a processing flow, when the operation for turning up the sound volume is performed as the operation on the sound volume control 7a, the processing of steps S102, S103, S104, and S101 is repeated according to the number of operations and the operation continuation time at that time as long as the level value $\alpha$ corresponding to the sound volume operation is in the range of the maximum value. As a result, the level value $\alpha$ corresponding to the sound volume operation is increased according to the number of times step S103 is repeatedly performed in accordance with the number of operations on the sound volume control 7a for turning up the sound volume and the operation continuation time. That is, the setting of the level value $\alpha$ corresponding to the sound volume operation according to the sound volume up operation is performed.

Furthermore, each time the level value $\alpha$ corresponding to the sound volume operation is increased by one step in step S103, the process returns to step S101, with the result that, for example, the sound volume display on the display section 7b is changed so as to show a level increase corresponding to the step increase of the level value $\alpha$ corresponding to the sound volume operation.

Similarly, when an operation for tuning down the sound volume is performed, the processing of steps S105, S106, S107, and S101 is repeated according to the number of operations and the operation continuation time as long as the level value $\alpha$ corresponding to the sound volume operation is in the range of the minimum value. Therefore, the setting of the level value $\alpha$ corresponding to the sound volume operation is performed in such a manner that the level value $\alpha$ corresponding to the sound volume operation is decreased according to the number of times step S105 is performed according to the number of operations and the operation continuation time.

Also, when the level value $\alpha$ corresponding to the sound volume operation is decreased by one step in step S105, the process returns to step S101. As a result, the sound volume display on the display section 7b is changed so as to show a level decrease corresponding to the decrease of the step of the level value $\alpha$ corresponding to the sound volume operation. In this manner, the sound volume level indicated by the sound volume display changes according to the operation performed on the sound volume control 7a by the user in the range from the minimum value to the maximum value.

FIG. 10 shows an example of the processing operation with respect to the entire sound volume control. The processing shown in FIG. 9 needs to be performed in conjunction with the processing shown in FIG. 10 when the main power supply is on.

Initially, in step S201, in a state in which the main power supply is switched off, the process waits for the main power supply to be switched on. The on/off state of the main power supply is switched according to the operation on the control for switching on/off the main power supply, the control being provided, for example, in the user interface section 7. The state in which the main power supply is off is a so-called standby state in which only parts to which standby power is supplied, for example, a microcomputer (and a reception section of a remote controller) serving as the system control section 6, can operate.

Then, if an affirmative result is obtained in step S201 in response to the main power supply being switched on, the processing in step S202 and subsequent steps in the state in which the main power supply is switched on is performed.

The processing of step S202, and the processing of step S203, which is performed subsequently, in response to the main power supply being switched on, are initialization operations for sound volume control.

For example, in response to the main power supply being switched off, various required setting values at that time are stored and held in, for example, a non-volatile storage area (for example, a flash memory, and a hard disk). Such an operation or information obtained by such an operation is called a "last memory". When the main power supply is switched on next, if various settings are performed by referring to the information of this last memory, the same setting environment as that of the previous switched-on state of the main power supply can be obtained.

In this embodiment, as one of such last memories, the level value α corresponding to the sound volume operation is also stored and held. In step S202, the level value α corresponding to the sound volume operation of the last memory is read and stored.

In step S203, the level correction value setting is turned off. That is, as described with reference to FIG. 8, 0 is set for the correction step for sound volume correction, and as a consequence, 0 is also set to the level correction value β.

In the subsequent step S204, after the current controlling signal level value (α+β) is determined, control for the level control section 42 is performed so that the digital audio signal level corresponding to the controlling signal level value (α+β) is reached.

The control for the level control section 42 in step S204 is performed by the control signal Sc2, and is performed commonly for the level control section 42 of each channel (see FIG. 4).

In the subsequent step S205, the process waits for 50 msec, which is a predetermined time length, to be elapsed. This is a process for producing a period TD described with reference to FIGS. 6 and 7, that is, the timing for detecting the detection flag flg_H or flg_L and for resetting the overflow detection section 43 corresponding to each channel.

Then, each time an affirmative determination result is obtained by determining that a predetermined time (50 msec) has elapsed in step S205, processing of step S206 and subsequent steps is performed.

In step S206, as described with reference to FIG. 4, the system control section 6 reads the detection flags flg_H and flg_L from the detection input ports Pt1 and Pt2. In the subsequent step S207, the system control section 6 outputs control signals Sc3_H and Sc3_L in order to reset the overflow detection section 43.

In FIG. 10, the timing of receiving the detection flags flg_H and flg_L in step S206, that is, the timing of scanning the detection input ports Pt1 and Pt2, may be, in practice, performed in a sequential manner in accordance with, for example, a predetermined clock-based timing. Similarly, in practice, the reset timing of the overflow detection section 43, that is, the output timing of the control signals Sc3_H and Sc3_L from the ports in step S207, may also be performed in a sequential manner in accordance with, for example, a predetermined clock-based timing.

In the subsequent step S208, as the read result of the detection flags flg_H and flg_L in step S206 at predetermined intervals (50 msec) up to this point, a determination is made as to whether or not the first condition as described with reference to FIG. 6 is satisfied. When an affirmative determination result is obtained in step S208 by determining that the first condition is satisfied, the process proceeds to step S209.

In step S209, a determination is made as to whether or not a variable n indicating the currently set stage of the correction step is a maximum value (16 is a maximum value in the example of FIG. 8). Here, when an affirmative determination result is obtained by determining that the variable n is a maximum value, step S210 to be described next is skipped, and the process directly returns to the process of step S204. That is, at this time, since the correction step has already reached the final stage, the stage of the correction step is not made to proceed any further, and the correction step up to this point is maintained. As also described above, in the correction step at the final stage, the sound volume of the output sound is corrected to such a degree that distortion that becomes problematical does not occur. Consequently, in practice, there are hardly any cases where an affirmative result is obtained in step S209.

When a negative determination result is obtained in step S209 by determining that the variable n is not a maximum value, the process proceeds to the process of step S210.

In step S210, the stage number that is incremented by 1 is set to the correction step n that has been set up to this point. That is, the correction step is made to proceed by one step. In response to this, for example, as shown in FIG. 8, a new value to which −1 dB, which is the amount of unit correction, is added, is set to the level correction value β up to this point.

After the process of step S210 is performed, the process returns to step S204.

When a negative determination result is obtained in step S208 by determining that the first condition is not satisfied at the current stage, in step S211, as the read results of the detection flags flg_H and flg_L in step S206 at interval of 50 msec up to this point, a determination is made as to whether or not the second condition is satisfied as described with reference to FIG. 7. When a negative determination result is obtained by determining that the second condition is not yet satisfied at the current stage in step S208, the process directly returns to step S204 without changing the correction step. On the other hand, when an affirmative determination result is obtained by determining that the second condition is satisfied, the process proceeds to step S212.

In step S212, a determination is made as to whether or not n=0, that is, correction step is 0, with respect to the variable n indicating the current stage of the correction step. As described with reference to FIG. 8, correction step 0 is a state in which the level correction value setting is substantially off and therefore, the level correction value β is 0.

When an affirmative result is obtained in step S212, since the stage of the correction step cannot be returned any further, the process directly proceeds to step S204 without changing the correction step.

On the other hand, when a negative result is obtained in step S212, the process proceeds to step S213.

In step S213, the stage number that is decremented by 1 is set to the correction step n that has been set up to this point. That is, the correction step is made to shift to the preceding stage. In response to this, a new value in which −1 dB, which is the amount of unit correction, is subtracted, is set to the level correction value β that has been set up to this point. After the process of step S213 is performed, the process returns to step S204.

As a result of returning to the process of step S204 after undergoing the process of step S210 or step S213 above, the controlling signal level value (α+β) is varied in such a manner that the level correction value β that is changed in consequence of the change of the stage of the correction step is reflected.

As a result, the audio signal that is output from the level control section 42 is always output at the level such that the level (based on the level value α corresponding to the sound volume operation) set in response to the operation on the sound volume control 7a is corrected by the amount of correction (based on the level correction value β) corresponding to the correction step.

In the earlier step S205, in the standby period until it is determined that a predetermined time (50 msec) has elapsed, processing of step S214 and subsequent steps is performed.

Initially, in step S214, a determination is made as to whether or not the function is switched. When a negative result is obtained in step S214, in the next step S215, a determination is made as to whether or not a CD is replaced (when the function mode is a CD).

When an affirmative determination result is obtained in one of step S214 or step S215, the process returns to step S203. As a result, as described with reference to FIG. 8, when the CD is replaced when the function is switched or the function mode is a CD, the level correction value setting is turned off, thereby resetting the level correction value β.

When a negative result is obtained in both steps S214 and S215, a determination is made in step S216 as to whether or not the main power supply is switched off. When an affirmative determination result is obtained as a result of the main power supply being switched off, the process returns to step S201, and the process waits for the main power supply to be switched on. In the manner described above, in the state in which the main power supply is off, the process waits for the main power supply to be switched on without particularly performing a process for level correction value setting. Therefore, the state in which the main power supply is off is substantially identical to the state in which the level correction value setting is turned off.

When a negative determination result is obtained step S216 as a result of the main power supply not being switched off, in step S217, when the function mode is a CD, a determination is made as to whether or not the track of the CD is changed (including the CD playback stop and temporary CD playback stop) in response to, for example, the progress of the playback or the operation on the user interface section 7. The track referred to herein is the management unit of the content corresponding to, for example, each musical piece.

When a negative determination result is obtained in step S217 by determining that the track is not changed, the process directly returns to the process of step S204. On the other hand, when an affirmative determination result is obtained by determining that the track is changed, the process returns to step S204 after the process of step S213 is performed. As a result, when the track of the CD is changed, the correction step is returned by one step, and therefore, the level of the audio signal output from the level control section 42 is decreased by −1 dB.

For example, in the vicinity of the beginning of a musical piece corresponding to the starting portion of the track, the possibility that the level becomes suddenly high is small, and in practice, the level is often low. For this reason, if the setting of the correction step immediately before the track playback starts is kept as is, an inconvenience can occur in that the playback sound volume of the track starting portion becomes too small. The sequence from step S217 to the process of step S213 is performed by considering to avoid such an inconvenience.

Based on the processing shown in FIG. 10, in the state in which, for example, the function mode is a CD and the playback is stopped or temporarily stopped, the correction step (the level correction value β) that has been set immediately before the playback stop or temporary stop is started is not changed and is maintained. However, when the operation for changing the track is performed in the state in which the playback is stopped or temporarily stopped, an affirmative determination result is obtained in step S217, and the correction step is returned by one step in step S213.

As can be seen from the processing shown in FIGS. 9 and 10, the sound volume display is changed on the basis of only the level value α corresponding to the sound volume operation, which is set in response to the operation on the sound volume control 7a, and the actual output level of the audio signal from the level control section 42, which is corrected in accordance with the correction step n at that time, is not reflected.

If the sound volume display is performed on the basis of the audio signal level (α+β) corrected in accordance with the correction step n, the following inconveniences occur.

It is assumed that, for example, a user outputs a considerably a heavy level of sound by operating the sound volume control 7a. At this time, if the sound volume correction function works, the user interface operates undesirably in such a manner that the sound volume level indicated by the sound volume display decreases even though the user does not perform a sound volume operation. Accordingly, in this embodiment, the configuration is formed as described above, thereby avoiding such inconveniences.

As a result of the sound volume correction control being performed in the manner described up to this point, in this embodiment, it becomes possible to prevent, for example, an occurrence of distortion that is sensed as deteriorating sound quality and an excessive input into the power amplifier side, which might lead to the destruction of circuits, the speaker, etc.

Here, as described with reference to FIG. 3, the overall configuration of the sound volume correction control system of this embodiment is a control system for the level control section 42 on the basis of the detection result of the presence or absence of an overflow with respect to the output of the level control section 42, and therefore, a feedback-based control system is formed. The main function of the level control section 42 is audio signal level setting in response to the sound volume operation.

Therefore, in this embodiment, when the audio signal level becomes excessive as a result of the sound volume operation being performed, the sound volume correction operates so as to suppress the sound volume.

For example, if a conventional sound volume correction control system is made to correspond to the configuration of this embodiment, control of sound volume suppression is performed on the basis of result in which the detection with respect to the level of the audio signal input to the level control section 42, that is, with respect to the level before the level setting corresponding to the sound volume operation is performed. In this configuration, the sound volume level is suppressed if the level as the sound source itself is excessive regardless of the sound volume operation.

In contrast, in this embodiment, even if the level of the sound source itself is comparatively high, the suppression of the sound volume level does not work in the case of a state of not particularly reaching an excessive input depending on the sound volume setting at that time.

As a result, for example, when the same sound source is played back at the sound volume operation level of approximately the same degree, the sound source can be listened to at, for example, satisfactory sound quality with rich sound volume sensation by an amount corresponding to that the sound volume is not inadvertently suppressed in this embodiment.

For performing the correction level value setting for sound volume correction control, as is understood from the flowchart in FIG. 10, the correction level value setting is mainly implemented by the determination process as to whether or not the first condition for proceeding the correction step or the second condition for returning the correction step is satisfied, and a process for incrementing the correction step value by 1 (proceeding the correction step by one step) or for decrementing by 1 (returning the correction step by one step) in accordance with the determination process. The amount of change of the level correction value β corresponding to one increment/one decrement of the correction step is fixed at 1 dB as an absolute value.

For example, the sound volume correction operation may be the correction level value setting of performing various condition settings and obtaining a correction level value that is different as appropriate according to the result of the conditional determination. However, in this case, since the condition settings are various, the conditional determination becomes complex. As a result, for example, the algorithm for sound volume correction performed by the system control section 6 becomes complex, the program becomes larger, causing a bad effect to occur, for example, the capacity of a ROM for storing a program is oppressed.

In contrast, in the case of an algorithm for correction level value setting as in this embodiment, when compared to the above-described conventional case, a simple program is formed. As a result, the size of a ROM for storing a program for the purpose of sound volume correction control can be reduced.

In this embodiment, as shown in FIG. 6, it takes a period of approximately one second for the determination as to the first condition. Furthermore, it takes a period of approximately three seconds for the determination as to the second condition. That is, it takes a comparatively long time of one second or three seconds even to proceed or return the correction step by one step. Then, also, when, for example, the audio signal level input to the power amplifier side is excessively higher or lower, and the correction step needs to proceed or return by several steps, a time from several seconds to several tens of seconds is required. That is, as a sensitivity at which the sound volume control works in response to the state in which the actual audio signal level becomes excessively higher or lower, a considerably low sensitivity is set.

For example, the time required for the above-described conditional determination can be set shorter in order to quickly respond to the audio signal level, so that a so-called level control operation close to a limiter is obtained. However, in this case, for example, even if the user performs a sound volume operation by thinking to produce a heavy sound volume with the consent that distortion occurs, since the sound volume suppression works from the early period, for a hearing sensation, the user senses that the actual sound volume is very small with respect to the amount of operation for the sound volume operation performed by the user himself/herself. This leads to having a negative impression of not having an impact from the viewpoint of sound quality, for example, for the user.

In contrast, in the case of this embodiment, for the time being after the user performs a sound volume operation by thinking to produce a heavy sound volume, sound is output at a volume that is heavy approximately proportional to the sound volume operation. As a result, the user does not sense the dissatisfaction that, for example, there is no impact from a hearing point of view. Then, as a result of the sound volume being reduced to a level in which the input to the power amplifier does not overflow for, for example, several seconds, the circuits, the speaker, etc., are protected. Furthermore, as a result of the level being reduced gradually in a step-wise manner, the sound is not recognized by the user as, for example, an unnatural sound volume change.

The present invention is not restricted to the embodiments described up to this point.

For example, in the above-described embodiments, when making a determination as to the first condition and the second condition shown in FIGS. 6 and 7, the presence or absence of an overflow with respect to the audio signal output is used as a reference therefor. The reason for this is that a state of becoming higher than or equal to a predetermined level by which an excessive input is regarded can be made to correspond to an overflow state. That is, in this embodiment, for example, when obtaining the result of the determination as to whether or not the level is higher than or equal to a predetermined level by which an excessive input is regarded, means other than overflow detection means can be adopted. The configuration may be formed in such a way that, for example, the level of the audio signal is actually detected, and a determination is made as to whether or not the level is higher than or equal to a predetermined level by which an excessive input is regarded by comparing the detection level with a threshold value.

Although the sampling timing of the detection flags flg_H and flg_L used for the determination as to the first condition and the second condition is set to 50 msec, other sampling timings may be used. Furthermore, although the determination period for the first condition and the second condition is set to, for example, approximately one second and three seconds, respectively, the time lengths of this determination period may be changed as appropriate. Based on the above, the elements for determining whether or not the first condition and the second condition are satisfied are not restricted to the content described with reference to FIGS. 6 and 7.

As an example, the configuration may be formed as follows. When the first condition shown in FIG. 6 is satisfied, whereas the correction step is made to proceed in units of one step as has been described up to this point, the determination as to the second condition shown in FIG. 7 is not performed. Thus, even if the signal level returns to a fixed level or lower, the operation for returning the correction step is not performed. Such a sequence can be regarded as setting infinity regarding the determination period of three seconds when making a determination as to the second condition shown in FIG. 7. In the case of such a sequence, even if the source sound volume becomes small, for example, in a comparatively short time, the correction step does not return following this. Therefore, when the sound source volume returns again to a heavy sound source volume, the sound volume can be effectively suppressed in the same correction step as the previous correction step. In such a case, the time when the correction step is returned by one step (there are cases in which the correction step is returned by two or more steps), as shown in, for example, step S217 of FIG. 10 is when the track of the CD is changed. In FIG. 10, when the function is switched or the CD is replaced, the process returns to step S203, whereby the correction step is initialized. Alternatively, similarly to the above-described case in which the track of the CD is changed, a sequence of returning the correction step by a predetermined number of steps may be used.

As shown in FIG. 4, in this embodiment, there are provided the first logical OR computation circuit 8-1 for computing the logical OR of the detection flags (flg_FL, flg_FR, flg_FC, flg_SL, and flg_SR) corresponding to the full-range channel group and the second logical OR computation circuit 82 for computing the logical OR of the detection flags (flg_SW1 and flg_SW2) corresponding to the subwoofer channel group. The system control section 6 receives the detection flags flg_H and flg_L, which are the outputs of the first logical OR computation circuit 8-1 and the second logical OR computation circuit 82, respectively.

In place of such a configuration, for example, the configuration may be formed in such a way that the system control section 6 reads all of the detection flags (flg_FL, flg_FR, flg_FC, flg_SL, and flg_SR) corresponding to the full-range channel group and the detection flags (flg_SW1 and flg_SW2) corresponding to the subwoofer channel group, and the logical OR of these detection flags is computed in the system control section 6.

However, if such a configuration is adopted, seven input ports of the microcomputer serving as the system control section 6 are required for sound volume correction control, and there is a possibility in that an infinite number of ports cannot be reused effectively. In contrast, if the configuration of this embodiment is adopted, there is the advantage in that only two input ports are required. Furthermore, depending on the case, the configuration may be formed in such a way that one logical OR computation circuit is provided, and all the detection flags (flg_FL, flg_FR, flg_FC, flg_SL, and flg_SR) corresponding to the full-range channel group and the detection flags (flg_SW1 and flg_SW2) corresponding to the subwoofer channel group are input to the logical OR computation circuit. In this case, based on only one detection flag as the computation output of the logical OR computation circuit, the system control section 6 makes a conditional determination as to the first condition and the second condition.

Although the embodiment has been described by using an example in which the present invention is applied to a multi-channel sound playback apparatus in which the full range is formed of five channels and the subwoofer is formed of two channels, the configuration of the multi-channel is not particularly restricted. The present invention can be applied to even a sound playback apparatus compatible with ordinary L and R stereo or a monaural-compatible sound playback apparatus.

In the configuration of the embodiment, both the level varying of the audio signal corresponding to the sound volume operation and the level varying of the audio signal corresponding to the sound volume correction are performed by control for the level control section 42. However, in this embodiment, for example, if a control system for performing level correction on the audio signal output at the level corresponding to the sound volume operation is formed only, the level varying of the audio signal corresponding to the sound volume operation and the level varying of the audio signal for the sound volume correction need not to be performed by the same circuit part. For example, in the case of the configuration of the sound playback apparatus of this embodiment, level control for sound volume correction can also be performed by the control for the PWM modulator 53 in the power amplifier block 5. In this case, the level can be determined by, for example, shifting the reference level used for PWM modulation.

Furthermore, in the embodiment, although a so-called digital power amplifier (a D-class amplifier) is used for the power amplifier, the configuration of the power amplifier stage needs not to be particularly limited. Therefore, the present invention can also be applied to a case in which an object for sound volume correction control is an analog audio signal.

What is claimed is:

1. A sound signal processing apparatus comprising:
   level varying means for outputting an input sound signal at a level $\alpha+\beta$, wherein $\alpha$ represents a sound volume operation level set by a sound volume varying operation and $\beta$ represents a correction level;
   determination means for determining at predetermined intervals whether or not the level $\alpha+\beta$ is higher than a predetermined value; and
   level correction means for updating $\beta$, wherein:
      when it is determined that the level $\alpha+\beta$ is higher than the predetermined value for a predetermined number of continuous determinations, the level of a current value of $\beta$ is increased by a first predetermined amount, and
      when it is determined that the level $\alpha+\beta$ is higher than the predetermined value for less than a predetermined number of determinations within a predetermined number of determinations, the level of the current value of $\beta$ is reduced by a second predetermined amount.

2. The sound signal processing apparatus according to claim 1, wherein the level correction means uses the level of the current value of $\beta$ as an initial value when a source of the input sound signal is changed.

3. The sound signal processing apparatus according to claim 1, wherein the level correction means updates the value of $\beta$ when a managing unit of the content is changed as a source of the input sound signal is changed.

4. The sound signal processing apparatus according to claim 1, wherein a plurality of the level correction means are provided for sound signals of a plurality of channels, and
   further comprising level detection means for detecting whether or not the sound signals of the plurality of channels are at a fixed or higher level and for outputting a logical addition of the detected results, wherein
   the level correction means updates the level $\beta$ by the predetermined value based on the result of the logical addition.

5. A sound signal processing method comprising:
   outputting an input sound signal at a level $\alpha+\beta$, wherein $\alpha$ represents a sound volume operation level set by a sound volume varying operation and $\beta$ represents a correction level;
   determining at predetermined intervals whether or not the level $\alpha+\beta$ is higher than a predetermined value; and
   updating $\beta$ wherein:
      when it is determined that the level $\alpha+\beta$ is higher than the predetermined value for a predetermined number of continuous determinations, the level of a current value of $\beta$ is increased by a first predetermined amount, and
      when it is determined that the level $\alpha+\beta$ is higher than the predetermined value for less than a predetermined number of determinations within a predetermined number of determinations, the level of the current value of $\beta$ is reduced by a second predetermined amount.

* * * * *